(12) United States Patent
Choi et al.

(10) Patent No.: US 11,936,384 B2
(45) Date of Patent: Mar. 19, 2024

(54) MULTI-BIT FLIP-FLOP CIRCUIT WITH REDUCED AREA AND REDUCED WIRE COMPLEXITY

(71) Applicant: SAMSUNG ELECTRONICS CO., LTD., Suwon-si (KR)

(72) Inventors: Wonhyun Choi, Suwon-si (KR); Hyunchul Hwang, Suwon-si (KR); Minsu Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/092,507

(22) Filed: Jan. 3, 2023

(65) Prior Publication Data

US 2023/0318584 A1 Oct. 5, 2023

(30) Foreign Application Priority Data

Mar. 29, 2022 (KR) .................. 10-2022-0039217
Jul. 14, 2022 (KR) .................. 10-2022-0087025

(51) Int. Cl.
*H03K 3/037* (2006.01)
*G01R 31/3185* (2006.01)
*H03K 3/3562* (2006.01)

(52) U.S. Cl.
CPC ... *H03K 3/0372* (2013.01); *G01R 31/318541* (2013.01); *H03K 3/037* (2013.01); *H03K 3/35625* (2013.01)

(58) Field of Classification Search
CPC .... H03K 3/037; H03K 3/0372; H03K 3/3562; H03K 3/35625; G11C 19/28; G11C 19/287; G01R 31/318541
See application file for complete search history.

(56) References Cited

U.S. PATENT DOCUMENTS

| 5,502,403 | A | 3/1996 | Liu et al. |
| 5,905,393 | A | 5/1999 | Rinderknecht et al. |
| 6,006,348 | A | 12/1999 | Sode et al. |
| 6,492,855 | B1 | 12/2002 | Pasqualini |
| 9,473,117 | B2 | 10/2016 | Kim et al. |

(Continued)

FOREIGN PATENT DOCUMENTS

JP 2017-096881 A 6/2017

OTHER PUBLICATIONS

Xiaoying Yu et al., A New Low Leakage Power Flip-Flop Based on Ratioed Latched With Power Gating, Procedia Environmental Sciences 11, 2011, 297-303, Zhejiang, China.

*Primary Examiner* — Patrick O Neill
(74) *Attorney, Agent, or Firm* — Fish & Richardson P.C.

(57) ABSTRACT

A multi-bit flip-flop includes a first bit flip-flop and a second bit flip-flop. The first bit flip-flop includes an input multiplexer that receives a first and second data bits, and outputs one of the first and second data bits as a third data bit; a first transmission circuit; a first latch; a second transmission circuit; and a second latch that outputs a first output data bit. The second bit flip-flop includes an input multiplexer that receives a fourth data bit and the first output data bit, and outputs one of the fourth data bit and the first output data bit as a fifth data bit; a first transmission circuit, a first latch, a second transmission circuit, and a second latch that outputs a second output data bit. The first output data bit is provided from the first bit flip-flop to the second bit flip-flop along an external wire.

20 Claims, 10 Drawing Sheets

(56) References Cited

U.S. PATENT DOCUMENTS

| | | |
|---|---|---|
| 9,729,128 B2 | 8/2017 | Srivastava et al. |
| 9,755,623 B2 | 9/2017 | Cheng et al. |
| 9,966,936 B2 | 5/2018 | Kim et al. |
| 10,353,000 B2 | 7/2019 | Yoon et al. |
| 11,115,009 B2 | 9/2021 | Nakanishi |
| 2020/0192997 A1* | 6/2020 | Kim .................. H01L 27/092 |
| 2020/0195237 A1* | 6/2020 | Lee ................ G01R 31/318541 |
| 2020/0395923 A1* | 12/2020 | Kim ............... G01R 31/318541 |
| 2021/0203311 A1 | 7/2021 | Liu et al. |
| 2021/0357567 A1 | 11/2021 | Sherlekar et al. |
| 2021/0391850 A1 | 12/2021 | Wang et al. |
| 2022/0385277 A1* | 12/2022 | Lim .................. H03K 3/35625 |

\* cited by examiner

MULTI-BIT FLIP-FLOP CIRCUIT WITH REDUCED AREA AND REDUCED WIRE COMPLEXITY

CROSS-REFERENCE TO RELATED APPLICATIONS

A claim of priority under 35 U.S.C. § 119 is made to Korean Patent Application No. 10-2022-0039217 filed on Mar. 29, 2022, and Korean Patent Application No. 10-2022-0087025 filed on Jul. 14, 2022, in the Korean Intellectual Property Office, the entirety of which are hereby incorporated by reference.

BACKGROUND

The present disclosure relates to electronic devices, and more particularly to multi-bit flip-flop circuits having the reduced area.

Flip-flops may store and output data in synchronization with a clock signal. Flip-flops are one of the most used components in electronic circuits. Accordingly, in the case where the area that a flip-flop occupies in a layout decreases, the total area of an electronic circuit may decrease. Also, in the case that wiring complexity of a flip-flop is decreased, the level of difficulty in the design of an electronic circuit may decrease.

SUMMARY

Embodiments of the inventive concepts provide a multi-bit flip-flop circuit having reduced area and reduced wiring complexity.

Embodiments of the inventive concepts provide a multi-bit flip-flop including a first bit flip-flop, and a second bit flip-flop. The first bit flip-flop includes a first input multiplexer that receives a first data bit as a data input, receives a second data bit as a scan input, and outputs one of the first data bit and the second data bit as a third data bit; a first transmission circuit that outputs a fourth data bit in response to the third data bit in synchronization with a clock signal and an inverse clock signal; a first latch that stores the fourth data bit in synchronization with the clock signal and the inverse clock signal; a second transmission circuit that outputs a fifth data bit in response to the fourth data bit in synchronization with the clock signal and the inverse clock signal; and a second latch that stores the fifth data bit and outputs a sixth data bit as a first output data bit in response to the fifth data bit. The second bit flip-flop includes a second input multiplexer that receives a seventh data bit as a data input, receives the sixth data bit as a scan input, and outputs one of the seventh data bit and the sixth data bit as an eighth data bit; a third transmission circuit that outputs a ninth data bit in response to the eighth data bit in synchronization with the clock signal and the inverse clock signal; a third latch that stores the ninth data bit in synchronization with the clock signal and the inverse clock signal; a fourth transmission circuit that outputs a tenth data bit in response to the ninth data bit in synchronization with the clock signal and the inverse clock signal; and a fourth latch that stores the tenth data bit and outputs an eleventh data bit as a second output data bit in response to the tenth data bit.

Embodiments of the inventive concepts further provide a multi-bit flip-flop including a signal generation circuit that receives a clock signal, outputs the clock signal and an inverse clock signal, receives a scan enable signal, and outputs the scan enable signal and an inverse scan enable signal; a first bit flip-flop; and a second bit flip-flop. The first bit flip-flop includes a first input multiplexer that receives a first data bit as a data input, receives a second data bit as a scan input, and outputs one of the first data bit and the second data bit as a third data bit in response to the scan enable signal and the inverse scan enable signal; a first transmission circuit that outputs a fourth data bit in response to the third data bit in synchronization with the clock signal and the inverse clock signal; a first latch that stores the fourth data bit in synchronization with the clock signal and the inverse clock signal; a second transmission circuit that outputs a fifth data bit in response to the fourth data bit in synchronization with the clock signal and the inverse clock signal; and a second latch that stores the fifth data bit and outputs a sixth data bit as a first output data bit in response to the fifth data bit. The second bit flip-flop includes a second input multiplexer that receives a seventh data bit as a data input, receives the sixth data bit as a scan input, and outputs one of the seventh data bit and the sixth data bit as an eighth data bit; a third transmission circuit that outputs a ninth data bit in response to the eighth data bit in synchronization with the clock signal and the inverse clock signal; a third latch that stores the ninth data bit in synchronization with the clock signal and the inverse clock signal; a fourth transmission circuit that outputs a tenth data bit in response to the ninth data bit in synchronization with the clock signal and the inverse clock signal; and a fourth latch that stores the tenth data bit and outputs an eleventh data bit as a second output data bit in response to the tenth data bit. The first input multiplexer and the second input multiplexer respectively set the third data bit and the eighth data bit to a reset value in response to a reset signal.

Embodiments of the inventive concepts still further provide a multi-bit flip-flop including a signal generation circuit that receives a clock signal, outputs the clock signal and an inverse clock signal, receives a scan enable signal, and outputs the scan enable signal and an inverse scan enable signal; a first bit flip-flop; and a second bit flip-flop. The first bit flip-flop includes a first input multiplexer that receives a first data bit as a data input, receives a second data bit as a scan input, and outputs one of the first data bit and the second data bit as a third data bit in response to the scan enable signal and the inverse scan enable signal; a first transmission circuit that outputs a fourth data bit in response to the third data bit in synchronization with the clock signal and the inverse clock signal; a first latch that stores the fourth data bit in synchronization with the clock signal and the inverse clock signal; a second transmission circuit that outputs a fifth data bit in response to the fourth data bit in synchronization with the clock signal and the inverse clock signal; and a second latch that stores the fifth data bit and outputs a sixth data bit as a first output data bit in response to the fifth data bit. The second bit flip-flop includes a second input multiplexer that receives a seventh data bit as a data input, receives the sixth data bit as a scan input, and outputs one of the seventh data bit and the sixth data bit as an eighth data bit; a third transmission circuit that outputs a ninth data bit in response to the eighth data bit in synchronization with the clock signal and the inverse clock signal; a third latch that stores the ninth data bit in synchronization with the clock signal and the inverse clock signal; a fourth transmission circuit that outputs a tenth data bit in response to the ninth data bit in synchronization with the clock signal and the inverse clock signal; and a fourth latch that stores the tenth data bit and outputs an eleventh data bit as a second output data bit in response to the tenth data bit. Each of the first and third transmission circuits include a first transmission gate, the first transmission gate of the first transmission circuit transfers the third data bit to be provided as the fourth data bit, and the first transmission gate of the third transmission circuit transfers the eighth data bit to be provided as the ninth data bit. The first latch includes a first inverter that receives the fourth data bit, and a first three-phase inverter that transfers an output of the first inverter to an input of the first inverter in synchronization with the clock signal and the inverse clock signal. The third latch includes a second inverter that receives the ninth data bit, and a second three-phase inverter that transfers an output of the second inverter to an input of the second inverter in synchronization with the clock signal and the inverse clock signal. Each of the second and fourth transmission circuits includes a third three-phase inverter. The third three-phase inverter of the second transmission circuit inverts the fourth data bit to provide the fifth data bit in synchronization with the clock signal and the inverse clock signal, and the third three-phase inverter of the fourth transmission circuit inverts the ninth data bit to provide the tenth data bit in synchronization with the clock signal and the inverse clock signal. The second latch includes a third inverter that receives the fifth data bit, a fourth inverter that receives an output of the third inverter and outputs the sixth data bit, and a second transmission gate that transfers the sixth data bit to an input of the third inverter in synchronization with the clock signal and the inverse clock signal. The fourth latch includes a fifth inverter that receives the tenth data bit, a sixth inverter that receives an output of the fifth inverter and outputs the eleventh data bit, and a third transmission gate that transfers the eleventh data bit to an input of the fifth inverter in synchronization with the clock signal and the inverse clock signal.

Embodiments of the inventive concepts also provide a multi-bit flip-flop including a cell body layer including active areas and gate lines implemented as transistors, the active areas extending in a first direction and the gate lines extending across the active areas in a second direction orthogonal to the first direction; and a cell metal layer including internal wirings that electrically interconnect the transistors in the cell body layer to implement the transistors as a plurality of bit flip-flops. The cell body layer and the cell metal layer together implement a standard cell of the multi-bit flip-flop including the plurality of bit flip-flops. An output data bit of a first bit flip-flop from among the plurality of bit flip-flops is electrically connected to an input of a second bit flip-flop from among the plurality of bit flip-flops through external wirings disposed outside of the standard cell.

BRIEF DESCRIPTION OF THE FIGURES

The above and other embodiments of the inventive concepts will become apparent in view of the following detailed description taken with reference to the accompanying drawings.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
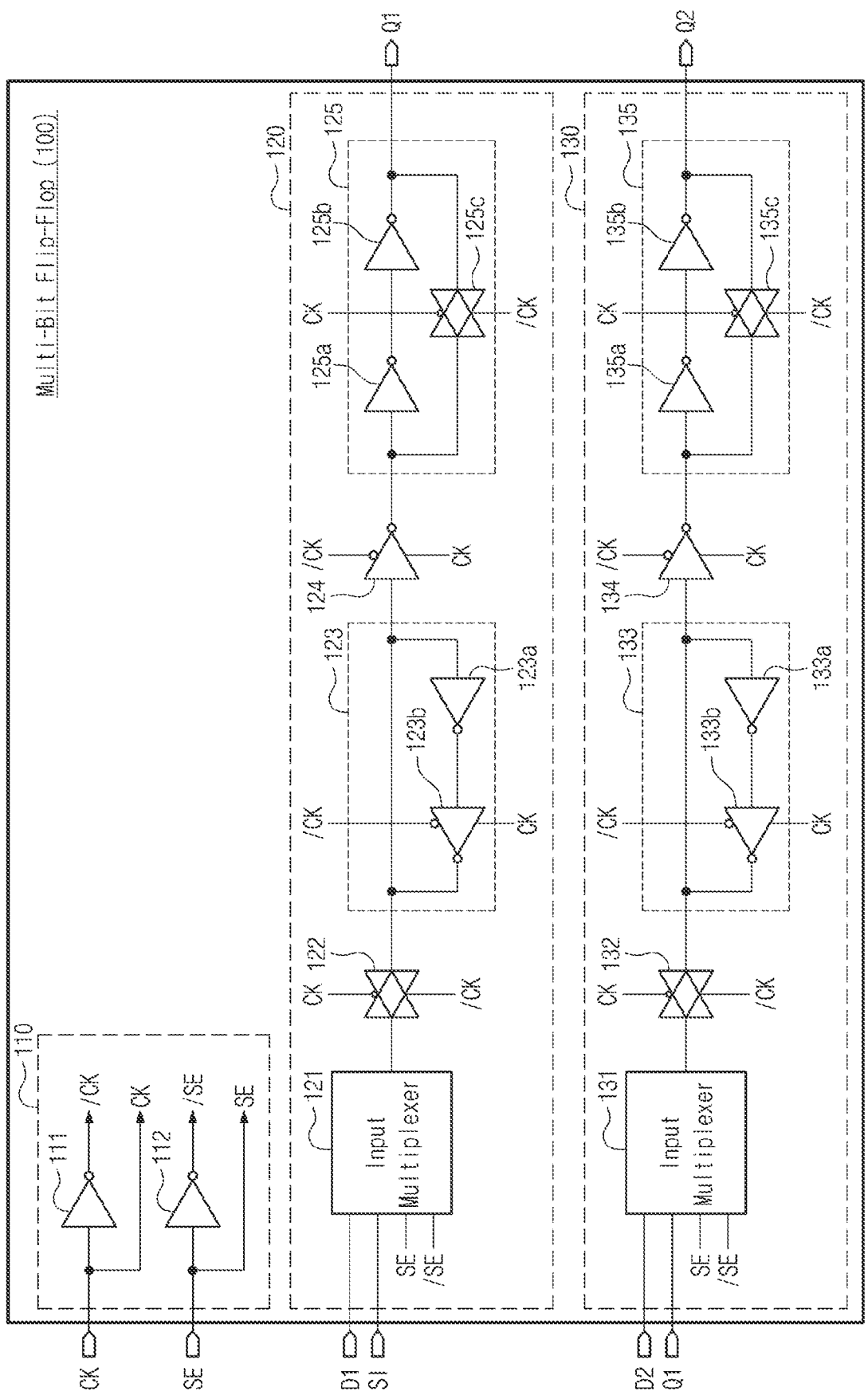
FIG. 1 illustrates a multi-bit flip-flop circuit according to an embodiment of the inventive concepts.

FIG. 1 illustrates a multi-bit flip-flop circuit 100 according to an embodiment of the inventive concepts. Referring to FIG. 1, the multi-bit flip-flop circuit 100 may include a signal generation circuit 110, a first bit flip-flop 120, and a second bit flip-flop 130.

In an embodiment, the multi-bit flip-flop circuit 100 may be implemented with (or as) a standard cell. The standard cell of the multi-bit flip-flop circuit 100 may include internal wires for connecting components of the multi-bit flip-flop circuit 100. The multi-bit flip-flop circuit 100 may be connected with external wires that are connected with external circuits. Hereinafter, an "internal wire(s)" may mean a wire(s) included in the standard cell of the multi-bit flip-flop circuit 100, and an "external wire(s)" may mean a wire(s) that is not included in the standard cell of the multi-bit flip-flop circuit 100 and that connects the multi-bit flip-flop circuit 100 with any other circuits. In FIG. 1, nodes that are connected with external wires are illustrated by pentagonal nodes so as to be distinguished from any other nodes.

The signal generation circuit 110 may receive a clock signal CK and a scan enable signal SE from the external wires. The signal generation circuit 110 may include a first inverter 111 generating an inverse clock signal /CK from the clock signal CK, and a second inverter 112 generating an inverse scan enable signal /SE from the scan enable signal SE. The signal generation circuit 110 may provide the first bit flip-flop 120 and the second bit flip-flop 130 with the clock signal CK, the inverse clock signal /CK, the scan enable signal SE, and the inverse scan enable signal /SE.

The first bit flip-flop 120 may receive a first data bit D1 and a scan input data bit SI from the external wires. The first bit flip-flop 120 may output one of the first data bit D1 and the scan input data bit SI as a first output data bit Q1 in synchronization with the clock signal CK and the inverse clock signal /CK. For example, when the scan enable signal SE and the inverse scan enable signal /SE are in a disable state, the first bit flip-flop 120 may output the first data bit D1 as the first output data bit Q1. When the scan enable signal SE and the inverse scan enable signal /SE are in an enable state, the first bit flip-flop 120 may output the scan input data bit SI as the first output data bit Q1.

The first bit flip-flop 120 may include an input multiplexer 121, a first transmission circuit 122, a first latch 123, a second transmission circuit 124, and a second latch 125.

The input multiplexer 121 may receive the first data bit D1 and the scan input data bit SI from the external wires. The input multiplexer 121 may output one of the first data bit D1 and the scan input data bit SI in response to the scan enable signal SE and the inverse scan enable signal /SE. When the scan enable signal SE and the inverse scan enable signal /SE are in the disable state, the input multiplexer 121 may output the first data bit D1. When the scan enable signal SE and the inverse scan enable signal /SE are in the enable state, the input multiplexer 121 may output the scan input data bit SI.

The first transmission circuit 122 may output an input data bit from the input multiplexer 121 as an output data bit in synchronization with the clock signal CK and the inverse clock signal /CK. For example, the first transmission circuit 122 may include a transmission gate that transfers the input data bit from the input multiplexer 121 as the output data bit in response to the clock signal CK and the inverse clock signal /CK.

The first latch 123 may store the input data bit from the first transmission circuit 122 in response to the clock signal CK and the inverse clock signal /CK and may output the input data bit as an output data bit. For example, the first latch 123 may store the input data bit from the first transmission circuit 122 in response to the clock signal CK and the inverse clock signal /CK and may output the input data bit as the output data bit.

The first latch 123 may include an inverter 123a receiving the input data bit, and a three-phase inverter 123b transferring an output of the inverter 123a as an input of the inverter 123a in response to the clock signal CK and the inverse clock signal /CK. A tri-state inverter which outputs "1" or "0" and which may also maintain a so-called high impedance state may be characterized as the three-phase inverter.

The second transmission circuit 124 may output an input data bit from the first latch 123 as an output data bit in synchronization with the clock signal CK and the inverse clock signal /CK. For example, the second transmission circuit 124 may include a three-phase inverter that inverts the input data bit from the input multiplexer 121 in synchronization with the clock signal CK and the inverse clock signal /CK so as to be output as an output data bit.

The second latch 125 may store the input data bit from the second transmission circuit 124 in response to the clock signal CK and the inverse clock signal /CK and may output the input data bit as the first output data bit Q1. For example, the second latch 125 may store the input data bit from the second transmission circuit 124 in response to the clock signal CK and the inverse clock signal /CK and may output the input data bit as the first output data bit Q1.

The second latch 125 may include a first inverter 125a receiving an input data bit, a second inverter 125b receiving an output of the first inverter 125a and outputting the first output data bit Q1, and a transmission gate 125c transferring an output of the second inverter 125b as an input of the first inverter 125a in synchronization with the clock signal CK and the inverse clock signal /CK.

The second bit flip-flop 130 may include an input multiplexer 131, a first transmission circuit 132, a first latch 133, a second transmission circuit 134, and a second latch 135.

The input multiplexer 131 may receive a second data bit D2 and the first output data bit Q1 from the external wires. The input multiplexer 131 may output one of the second data bit D2 and the first output data bit Q1 in response to the scan enable signal SE and the inverse scan enable signal /SE. When the scan enable signal SE and the inverse scan enable signal /SE are in the disable state, the input multiplexer 131 may output the second data bit D2. When the scan enable signal SE and the inverse scan enable signal /SE are in the enable state, the input multiplexer 131 may output the first output data bit Q1.

The first transmission circuit 132 may output an input data bit from the input multiplexer 131 as an output data bit in synchronization with the clock signal CK and the inverse clock signal /CK. For example, the first transmission circuit 132 may include a transmission gate that transfers the input data bit from the input multiplexer 131 as the output data bit in response to the clock signal CK and the inverse clock signal /CK.

The first latch 133 may store the input data bit from the first transmission circuit 132 in response to the clock signal CK and the inverse clock signal /CK and may output the input data bit as an output data bit. For example, the first latch 133 may store the input data bit from the first transmission circuit 132 in response to the clock signal CK and the inverse clock signal /CK and may output the input data bit as the output data bit.

The first latch 133 may include an inverter 133a receiving the input data bit, and a three-phase inverter 133b transferring an output of the inverter 133a as an input of the inverter 133a in response to the clock signal CK and the inverse clock signal /CK.

The second transmission circuit 134 may output an input data bit from the first latch 133 as an output data bit in synchronization with the clock signal CK and the inverse clock signal /CK. For example, the second transmission circuit 134 may include a three-phase inverter that inverts the input data bit from the input multiplexer 131 in synchronization with the clock signal CK and the inverse clock signal /CK so as to be output as an output data bit.

The second latch 135 may store the input data bit from the second transmission circuit 134 in response to the clock signal CK and the inverse clock signal /CK and may output the input data bit as the second output data bit Q2. For example, the second latch 135 may store the input data bit from the second transmission circuit 134 in response to the clock signal CK and the inverse clock signal /CK and may output the input data bit as the second output data bit Q2.

The second latch 135 may include a first inverter 135a receiving an input data bit, a second inverter 135b receiving an output of the first inverter 135a and outputting the second output data bit Q2, and a transmission gate 135c transferring an output of the second inverter 135b as an input of the first inverter 135a in synchronization with the clock signal CK and the inverse clock signal /CK.

When the scan enable signal SE and the inverse scan enable signal /SE are in the disable state, the first bit flip-flop 120 may store the first data bit D1 received from the external wires and may output the first data bit D1 as the first output data bit Q1. The second bit flip-flop 130 may store the second data bit D2 received from the external wires and may output the second data bit D2 as the second output data bit Q2.

When the scan enable signal SE and the inverse scan enable signal /SE are in the enable state, the first bit flip-flop 120 may store the scan input data bit SI received from the external wires and may output the scan input data bit SI as the first output data bit Q1. The second bit flip-flop 130 may store the first output data bit Q1 received from the external wires and may output the first output data bit Q1 as the second output data bit Q2.

That is, because the first output data bit Q1 is transferred from the external wires as a scan input of the second bit flip-flop 130, the standard cell of the multi-bit flip-flop circuit 100 does not require separate internal wires for connecting an arbitrary node of the first bit flip-flop 120 with the scan input of the second bit flip-flop 130. A wire for connecting the first output data bit Q1 with the external wires and a wire for the scan input of the second bit flip-flop 130 are included in internal wires of the standard cell of the multi-bit flip-flop circuit 100 by default. Because a separate internal wire for connecting an arbitrary node of the first bit flip-flop 120 and the scan input of the second bit flip-flop 130 is omitted without adding an additional component to the standard cell of the multi-bit flip-flop circuit 100, the wiring complexity of the multi-bit flip-flop circuit 100 may be decreased.

Figure 2:
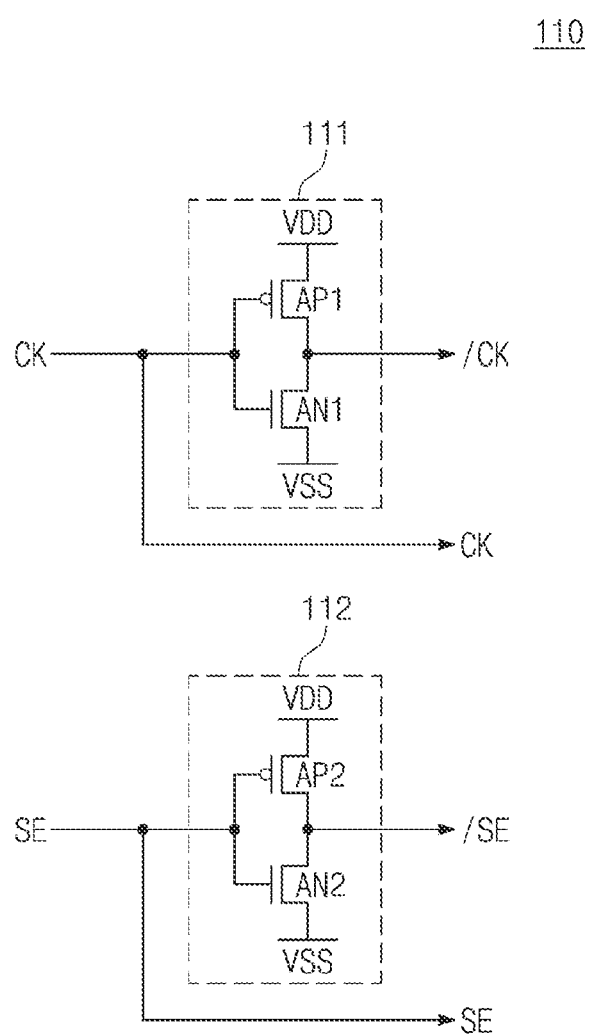
FIG. 2 illustrates a circuit diagram of a signal generation circuit of the multi-bit flip-flop of FIG. 1.

FIG. 2 illustrates a circuit diagram of the signal generation circuit 110 of the multi-bit flip-flop circuit 100 of FIG. 1. Referring to FIGS. 1 and 2, the first inverter 111 includes a first P-type transistor AP1 and a first N-type transistor AN1 that are connected in series between a power node to which a power supply voltage VDD is supplied and a ground node to which a ground voltage VSS is supplied. The clock signal CK may be transferred in common to a gate of the first P-type transistor AP1 and a gate of the first N-type transistor AN1. A signal of a (connection) node between the first P-type transistor AP1 and the first N-type transistor AN1 may be output as the inverse clock signal /CK.

The second inverter 112 includes a second P-type transistor AP2 and a second N-type transistor AN2 that are connected in series between the power node to which the power supply voltage VDD is supplied and the ground node to which the ground voltage VSS is supplied. The scan enable signal SE may be transferred in common to a gate of the second P-type transistor AP2 and a gate of the second N-type transistor AN2. A signal of a (connection) node between the second P-type transistor AP2 and the second N-type transistor AN2 may be output as the inverse scan enable signal /SE.

Figure 3:
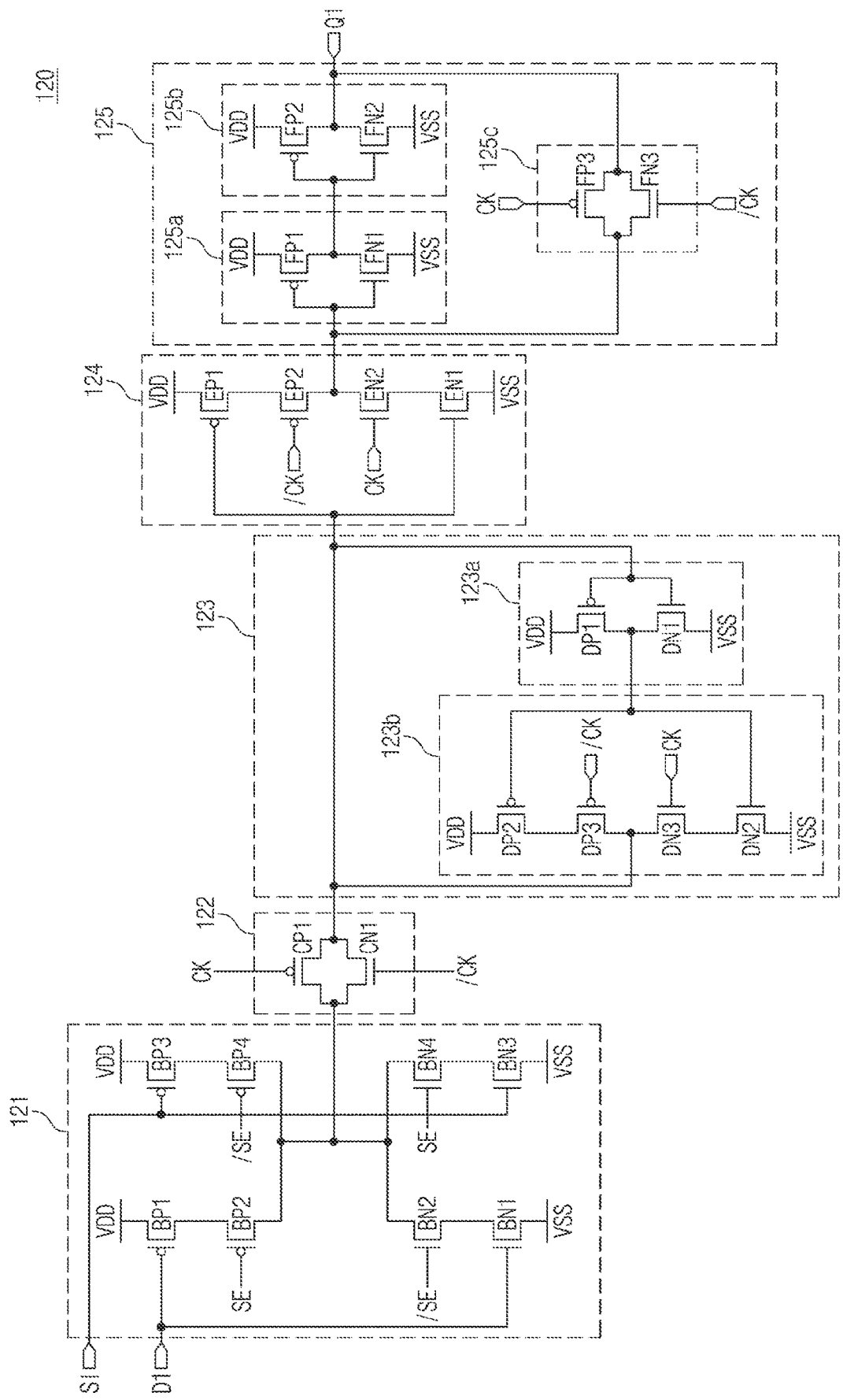
FIG. 3 illustrates a circuit diagram of a first bit flip-flop of the multi-bit flip-flop circuit of FIG. 1.

FIG. 3 illustrates a circuit diagram of the first bit flip-flop 120 of the multi-bit flip-flop circuit 100 of FIG. 1. Referring to FIGS. 1 and 3, the input multiplexer 121 may include a first P-type transistor BP1, a second P-type transistor BP2, a third P-type transistor BP3, a fourth P-type transistor BP4, a first N-type transistor BN1, a second N-type transistor BN2, a third N-type transistor BN3, and a fourth N-type transistor BN4.

The first P-type transistor BP1 and the second P-type transistor BP2 may be serially connected between the power node to which the power supply voltage VDD is supplied and an output node of the input multiplexer 121. The third P-type transistor BP3 and the fourth P-type transistor BP4 may be serially connected between the power node to which the power supply voltage VDD is supplied and the output node of the input multiplexer 121. A set of the first P-type transistor BP1 and the second P-type transistor BP2 may be connected in parallel with a set of the third P-type transistor BP3 and the fourth P-type transistor BP4.

The first N-type transistor BN1 and the second N-type transistor BN2 may be serially connected between the output node of the input multiplexer 121 and the ground node to which the ground voltage VSS is supplied. The third N-type transistor BN3 and the fourth N-type transistor BN4 may be serially connected between the output node of the input multiplexer 121 and the ground node to which the ground voltage VSS is supplied. A set of the first N-type transistor BN1 and the second N-type transistor BN2 may be connected in parallel with a set of the third N-type transistor BN3 and the fourth N-type transistor BN4.

The first data bit D1 may be transferred in common to a gate of the first P-type transistor BP1 and a gate of the first N-type transistor BN1. The scan enable signal SE may be transferred to a gate of the second P-type transistor BP2 and a gate of the fourth N-type transistor BN4. The scan input data bit SI may be transferred in common to a gate of the third P-type transistor BP3 and a gate of the third N-type transistor BN3. The inverse scan enable signal /SE may be transferred to a gate of the fourth P-type transistor BP4 and a gate of the second N-type transistor BN2.

The first transmission circuit 122 may include a first P-type transistor CP1 and a first N-type transistor CN1. The first P-type transistor CP1 and the first N-type transistor CN1 may be connected in parallel to form a transmission gate. The clock signal CK may be transferred to a gate of the first P-type transistor CP1, and the inverse clock signal /CK may be transferred to a gate of the first N-type transistor CN1.

The inverter 123a of the first latch 123 includes a first P-type transistor DP1 and a first N-type transistor DN1 that are connected in series between the power node to which the power supply voltage VDD is supplied and the ground node to which the ground voltage VSS is supplied. An output of the first transmission circuit 122 or an output of the three-phase inverter 123b may be transferred in common to a gate of the first P-type transistor DP1 and a gate of the first N-type transistor DN1. The inverter 123a may output a signal of a (connection) node between the first P-type transistor DP1 and the first N-type transistor DN1.

The three-phase inverter 123b of the first latch 123 may include a second P-type transistor DP2, a third P-type transistor DP3, a second N-type transistor DN2, and a third N-type transistor DN3 serially connected between the power node to which the power supply voltage VDD is supplied and the ground node to which the ground voltage VSS is supplied. An output of the inverter 123a may be transferred in common to a gate of the second P-type transistor DP2 and a gate of the second N-type transistor DN2. The inverse clock signal /CK may be transferred to a gate of the third P-type transistor DP3, and the clock signal CK may be transferred to a gate of the third N-type transistor DN3. The three-phase inverter 123b may output a signal of a (connection) node between the third P-type transistor DP3 and the third N-type transistor DN3.

The first latch 123 may output and store a data bit transferred from the first transmission circuit 122 and/or a data bit output from the three-phase inverter 123b.

The second transmission circuit 124 may include a first P-type transistor EP1, a second P-type transistor EP2, a first N-type transistor EN1, and a second N-type transistor EN2 serially connected between the power node to which the power supply voltage VDD is supplied and the ground node to which the ground voltage VSS is supplied. An output of the first latch 123 may be transferred in common to a gate of the first P-type transistor EP1 and a gate of the first N-type transistor EN1. The inverse clock signal /CK may be transferred to a gate of the second P-type transistor EP2, and the clock signal CK may be transferred to a gate of the second N-type transistor EN2. The second transmission circuit 124 may output a signal of a (connection) node between the second P-type transistor EP2 and the second N-type transistor EN2.

The first inverter 125a of the second latch 125 includes a first P-type transistor FP1 and a first N-type transistor FN1 that are connected in series between the power node to which the power supply voltage VDD is supplied and the ground node to which the ground voltage VSS is supplied. An output of the second transmission circuit 124 or an output of the transmission gate 125c may be transferred in common to a gate of the first P-type transistor FP1 and a gate of the first N-type transistor FN1. The first inverter 125a may output a signal of a (connection) node between the first P-type transistor FP1 and the first N-type transistor FN1.

The second inverter 125b of the second latch 125 includes a second P-type transistor FP2 and a second N-type transistor FN2 that are connected in series between the power node to which the power supply voltage VDD is supplied and the ground node to which the ground voltage VSS is supplied. An output of the first inverter 125a may be transferred in common to a gate of the second P-type transistor FP2 and a gate of the second N-type transistor FN2. The second inverter 125b may output a signal of a (connection node between the second P-type transistor FP2 and the second N-type transistor FN2.

The transmission gate 125c of the second latch 125 may include a third P-type transistor FP3 and a third N-type transistor FN3. The third P-type transistor FP3 and the third N-type transistor FN3 may be connected in parallel. The clock signal CK may be transferred to a gate of the third P-type transistor FP3, and the inverse clock signal /CK may be transferred to a gate of the third N-type transistor FN3.

The second bit flip-flop 130 may have the same structure as the first bit flip-flop 120 except that the first output data bit Q1 is received as the scan input. Thus, additional description will be omitted to avoid redundancy. Unless otherwise mentioned, the features described with reference to the first bit flip-flop 120 may be identically applied to the second bit flip-flop 130.

Figure 4:
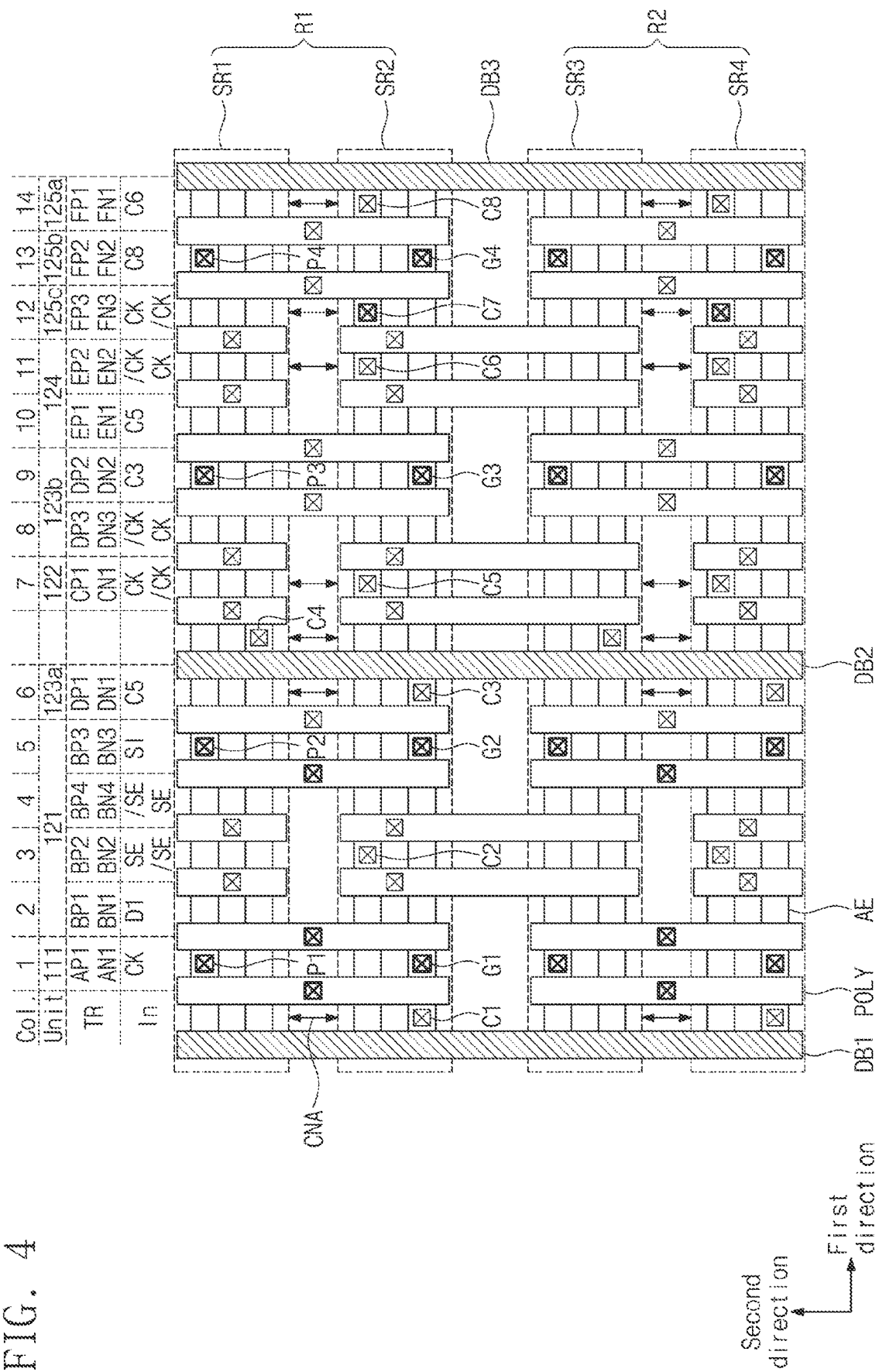
FIG. 4 illustrates a plan view of a multi-bit flip-flop circuit described with reference to FIGS. 2 and 3, according to an embodiment of the inventive concepts.

FIG. 4 illustrates a plan view of the multi-bit flip-flop circuit 100 described with reference to FIGS. 2 and 3, according to an embodiment of the inventive concepts. In an embodiment, elements of the multi-bit flip-flop circuit 100 will be described with reference to a first direction and a second direction.

Referring to FIGS. 1, 2, 3, and 4, in a first region R1 and a second region R2, active elements AE may extend in the first direction and may be spaced from each other in the second direction. For example, the active elements AE may include a Fin, a nanowire, a nanosheet, etc., but the inventive concepts are not limited to the above elements. For example, the first direction may be orthogonal with respect to the second direction.

The first region R1 may include a first sub-region SR1 and a second sub-region SR2. The second region R2 may include a third sub-region SR3 and a fourth sub-region SR4. In the first sub-region SR1 and the fourth sub-region SR4, portions corresponding to sources and/or drains of the active elements AE may be doped with P-type impurities, and portions corresponding to bodies thereof may be doped with N-type impurities. In the second sub-region SR2 and the third sub-region SR3, portions corresponding to sources and/or drains of the active elements AE may be doped with N-type impurities, and portions corresponding to bodies thereof may be doped with P-type impurities.

The active elements AE may be separated by a first diffusion brake DB1, a second diffusion brake DB2, and a third diffusion brake DB3 that extend in the second direction and are spaced from each other in the first direction.

The first diffusion brake DB1 and the third diffusion brake DB3 may prevent diffusion from occurring between the multi-bit flip-flop circuit 100 and any other components. The second diffusion brake DB2 may prevent diffusion from occurring between components of the multi-bit flip-flop circuit 100. Each of the first diffusion brake DB1, the second diffusion brake DB2, and the third diffusion brake DB3 may be formed by forming a trench breaking off materials causing diffusion in association with active elements and filling the trench with an insulation material.

Polys (i.e., polysilicon) POLY that extend in the second direction and are spaced from each other in the first direction may be disposed on the active elements AE. The polys POLY may function as gates of transistors. In FIG. 4, the polys POLY may be counted as first to fourteenth columns along the first direction. Hereinafter, a correspondence relationship between the circuit diagrams of FIGS. 2 and 3 and the plan view of FIG. 4 will be described with reference to the polys POLY.

In FIG. 4, a connecting arrow CNA may indicate that a source/drain region of the first sub-region SR1 and a source/drain region of the second sub-region SR2 are electrically connected with each other. For example, the source/drain region of the first sub-region SR1 and the source/drain region of the second sub-region SR2 may be expanded and may contact each other. In FIG. 4, a square marked by "X" may indicate a contact. The contact may be connected with a via that extends in a direction perpendicular to the first direction and the second direction.

The poly "POLY" at the first column of the first region R1 may form transistors TR of the first inverter 111 belonging to units of the first bit flip-flop 120, together with adjacent source/drain regions of the active elements AE in the first region RE In the first sub-region SR1, the poly "POLY" at the first column may form the first P-type transistor APE In the second sub-region SR2, the poly "POLY" may form the first N-type transistor AN1. The first inverter 111 may receive the power supply voltage VDD from a first power contact P1 and may receive the ground voltage VSS from a first ground contact G1. The first inverter 111 may receive the clock signal CK as an input In from the poly "POLY" at the first column The first inverter 111 may output an output signal (e.g., the inverse clock signal /CK) through a first contact C1. The clock signal CK and the inverse clock signal /CK may be transferred to contacts requiring the clock signal CK and the inverse clock signal /CK through internal wires (not shown in FIG. 4).

Likewise, the poly "POLY" at the first column of the second region R2 may form the second inverter 112. The second inverter 112 may output the inverse scan enable signal /SE. The scan enable signal SE and the inverse scan enable signal /SE may be transferred to contacts requiring the scan enable signal SE and the inverse scan enable signal /SE through internal wires.

The poly "POLY" at the second column of the first region R1 may form the first P-type transistor BP1 and the first N-type transistor BN1 of transistors TR of the input multiplexer 121 belonging to the units of the first bit flip-flop 120, together with adjacent source/drain regions of the active elements AE in the first region RE In the first sub-region SR1, the poly "POLY" at the second column may form the first P-type transistor BP1. In the second sub-region SR2, the poly "POLY" at the second column may form the first N-type transistor BN1. The first P-type transistor BP1 may receive the power supply voltage VDD from the first power contact P1, and the first N-type transistor BN1 may receive the ground voltage VSS from the first ground contact G1. The first P-type transistor BP1 and the first N-type transistor BN1 may receive the first data bit D1 as an input In from the poly "POLY" at the second column. Outputs of the first P-type transistor BP1 and the first N-type transistor BN1 may be transferred to the polys POLY at the third column along the first direction.

The polys POLY at the third column of the first region R1 may form the second P-type transistor BP2 and the second N-type transistor BN2 of the transistors TR of the input multiplexer 121 belonging to the units of the first bit flip-flop 120, together with adjacent source/drain regions of the active elements AE in the first region RE In the first sub-region SR1, the poly "POLY" at the third column may form the second P-type transistor BP2. In the second sub-region SR2, the poly "POLY" at the third column may form the second N-type transistor BN2. The second P-type transistor BP2 may receive the scan enable signal SE as an input In from the poly "POLY" at the third column. The second N-type transistor BN2 may receive the inverse scan enable signal /SE as an input In from the poly "POLY" at the third column.

The poly "POLY" at the fifth column of the first region R1 may form the third P-type transistor BP3 and the third N-type transistor BN3 of the transistors TR of the input multiplexer 121 belonging to the units of the first bit flip-flop 120, together with adjacent source/drain regions of the active elements AE in the first region RE In the first sub-region SR1, the poly "POLY" at the fifth column may form the third P-type transistor BP3. In the second sub-region SR2, the poly "POLY" at the fifth column may form the third N-type transistor BN3. The third P-type transistor BP3 may receive the power supply voltage VDD from a second power contact P2, and the third N-type transistor BN3 may receive the ground voltage VSS from a second ground contact G2. The third P-type transistor BP3 and the third N-type transistor BN3 may receive the scan input data bit SI as an input In from the poly "POLY" at the fifth column. Outputs of the third P-type transistor BP3 and the third N-type transistor BN3 may be transferred to the polys POLY at the fourth column along a direction facing away from the first direction.

The polys POLY at the fourth column of the first region R1 may form the fourth P-type transistor BP4 and the fourth N-type transistor BN4 of the transistors TR of the input multiplexer 121 belonging to the units of the first bit flip-flop 120, together with adjacent source/drain regions of the active elements AE in the first region RE In the first sub-region SR1, the poly "POLY" at the fourth column may form the fourth P-type transistor BP4. In the second sub-region SR2, the poly "POLY" at the fourth column may form the fourth N-type transistor BN4. The fourth P-type transistor BP4 may receive the inverse scan enable signal /SE as an input In from the poly "POLY" at the fourth column. The fourth N-type transistor BN4 may receive the scan enable signal SE as an input In from the poly "POLY" at the fourth column.

The input multiplexer 121 may output an output signal through a second contact C2. Likewise, the polys POLY at the first to fifth columns of the second region R2 may form the input multiplexer 131 of the second bit flip-flop 130. As a scan input, the first output data bit Q1 may be input to the poly "POLY" at the fifth column of the second region R2.

The poly "POLY" at the sixth column of the first region R1 may form transistors TR of the inverter 123a of the first latch 123 belonging to the units of the first bit flip-flop 120, together with adjacent source/drain regions of the active elements AE in the first region RE In the first sub-region SR1, the poly "POLY" at the sixth column may form the first P-type transistor DP1. In the second sub-region SR2, the poly "POLY" at the sixth column may form the first N-type transistor DN1. The inverter 123a may receive the power supply voltage VDD from the second power contact P2 and may receive the ground voltage VSS from the second ground contact G2. The inverter 123a may receive a signal of a fifth contact C5 as an input In from the poly "POLY" at the sixth column. The inverter 123a may output an output signal through a third contact C3. Likewise, the poly "POLY" at the sixth column of the second region R2 may form the first latch 133 of the second bit flip-flop 130.

The polys POLY at the seventh column of the first region R1 may form the first P-type transistor CP1 and the first N-type transistor CN1 of transistors TR of the first transmission circuit 122 belonging to the units of the first bit flip-flop 120, together with adjacent source/drain regions of the active elements AE in the first region RE In the first sub-region SR1, the poly "POLY" at the seventh column may form the first P-type transistor CP1. In the second sub-region SR2, the poly "POLY" at the seventh column may form the first N-type transistor CN1. The first P-type transistor CP1 may receive the clock signal CK as an input In from the poly "POLY" at the seventh column. The first N-type transistor CN1 may receive the inverse clock signal /CK as an input In from the poly "POLY" at the seventh column. The first transmission circuit 122 may output a signal transferred through a fourth contact C4 to the fifth contact C5 in synchronization with the clock signal CK and the inverse clock signal /CK. The fourth contact C4 may be connected with the second contact C2 through internal wires. Likewise, the polys POLY at the seventh column of the second region R2 may form the first transmission circuit 132 of the second bit flip-flop 130.

The poly "POLY" at the ninth column of the first region R1 may form the second P-type transistor DP2 and the second N-type transistor DN2 of transistors TR of the three-phase inverter 123b of the first latch 123 belonging to the units of the first bit flip-flop 120, together with adjacent source/drain regions of the active elements AE in the first region R1. In the first sub-region SRL the poly "POLY" at the ninth column may form the second P-type transistor DP2. In the second sub-region SR2, the poly "POLY" at the ninth column may form the second N-type transistor DN2. The second P-type transistor DP2 may receive the power supply voltage VDD from a third power contact P3, and the second N-type transistor DN2 may receive the ground voltage VSS from a third ground contact G3. The second P-type transistor DP2 and the second N-type transistor DN2 may receive the signal of the third contact C3 as an input In from the poly "POLY" at the ninth column. Outputs of the second P-type transistor DP2 and the second N-type transistor DN2 may be transferred to the polys POLY at the eighth column along the direction facing away from the first direction.

The polys POLY at the eighth column of the first region R1 may form the third P-type transistor DP3 and the third N-type transistor DN3 of the transistors TR of the three-phase inverter 123b of the first latch 123 belonging to the units of the first bit flip-flop 120, together with adjacent source/drain regions of the active elements AE in the first region RE In the first sub-region SRL the poly "POLY" at the eighth column may form the third P-type transistor DP3. In the second sub-region SR2, the poly "POLY" at the eighth column may form the third N-type transistor DN3. The third P-type transistor DP3 may receive the inverse clock signal /CK as an input In from the poly "POLY" at the eighth column The third N-type transistor DN3 may receive the clock signal CK as an input In from the poly "POLY" at the eighth column.

The first latch 123 may output an output signal through the fifth contact C5. Likewise, the polys POLY at the sixth column, the eighth column, and the ninth column of the second region R2 may form the first latch 133 of the second bit flip-flop 130.

The poly "POLY" at the tenth column of the first region R1 may form the first P-type transistor EP1 and the first N-type transistor EN1 of transistors TR of the second transmission circuit 124 belonging to the units of the first bit flip-flop 120, together with adjacent source/drain regions of the active elements AE in the first region RE In the first sub-region SRL the poly "POLY" at the tenth column may form the first P-type transistor EP1. In the second sub-region SR2, the poly "POLY" at the tenth column may form the first N-type transistor EN1. The first P-type transistor EP1 may receive the power supply voltage VDD from the third power contact P3, and the first N-type transistor EN1 may receive the ground voltage VSS from the third ground contact G3. The first P-type transistor EP1 and the first N-type transistor EN1 may receive the signal of the fifth contact C5 as an input In from the poly "POLY" at the tenth column. Outputs of the first P-type transistor EP1 and the first N-type transistor EN1 may be transferred to the polys POLY at the eleventh column along the first direction.

The polys POLY at the eleventh column of the first region R1 may form the second P-type transistor EP2 and the second N-type transistor EN2 of the transistors TR of the second transmission circuit 124 belonging to the units of the first bit flip-flop 120, together with adjacent source/drain regions of the active elements AE in the first region RE In the first sub-region SRL the poly "POLY" at the eleventh column may form the second P-type transistor EP2. In the second sub-region SR2, the poly "POLY" at the eleventh column may form the second N-type transistor EN2. The second P-type transistor EP2 may receive the inverse clock signal /CK as an input In from the poly "POLY" at the eleventh column. The second N-type transistor EN2 may receive the clock signal CK as an input In from the poly "POLY" at the eleventh column.

The second transmission circuit 124 may output an output signal through a sixth contact C6. Likewise, the polys POLY at the tenth and eleventh columns of the second region R2 may form the second transmission circuit 134 of the second bit flip-flop 130.

The poly "POLY" at the thirteenth column of the first region R1 may form the second P-type transistor FP2 and the second N-type transistor FN2 of transistors TR of transistors TR of the second inverter 125b of the second latch 125 belonging to the units of the first bit flip-flop 120, together with adjacent source/drain regions of the active elements AE in the first region RE In the first sub-region SR1, the poly "POLY" at the thirteenth column may form the second P-type transistor FP2. In the second sub-region SR2, the poly "POLY" at the thirteenth column may form the second N-type transistor FN2. The second P-type transistor FP2 may receive the power supply voltage VDD from a fourth power contact P4, and the second N-type transistor FN2 may receive the ground voltage VSS from a fourth ground contact G4. The second P-type transistor FP2 and the second N-type transistor FN2 may receive a signal of an eighth contact C8 as an input In from the poly "POLY" at the thirteenth column. Outputs of the second P-type transistor FP2 and the second N-type transistor FN2 may be transferred to the polys POLY at the twelfth column along the direction facing away from the first direction and may be output as the first output data bit Q1 at a seventh contact C7.

The polys POLY at the twelfth column of the first region R1 may form the third P-type transistor FP3 and the third N-type transistor FN3 of transistors TR of the transmission gate 125c of the second latch 125 belonging to the units of the first bit flip-flop 120, together with adjacent source/drain regions of the active elements AE in the first region RE In the first sub-region SRL the poly "POLY" at the twelfth column may form the third P-type transistor FP3. In the second sub-region SR2, the poly "POLY" at the twelfth column may form the third N-type transistor FN3. The third P-type transistor FP3 may receive the clock signal CK as an input In from the poly "POLY" at the twelfth column The third N-type transistor FN3 may receive the inverse clock signal /CK as an input In from the poly "POLY" at the twelfth column. The transmission gate 125c may transfer a signal of the seventh contact C7 to the sixth contact C6 in synchronization with the clock signal CK and the inverse clock signal /CK.

The poly "POLY" at the fourteenth column of the first region R1 may form transistors TR of the inverter 125a of the second latch 125 belonging to the units of the first bit flip-flop 120, together with adjacent source/drain regions of the active elements AE in the first region RE In the first sub-region SRL the poly "POLY" at the fourteenth column may form the first P-type transistor FP1. In the second sub-region SR2, the poly "POLY" at the fourteenth column may form the first N-type transistor FN1. The inverter 125a may receive the power supply voltage VDD from the fourth power contact P4 and may receive the ground voltage VSS from the fourth ground contact G4. The inverter 125a may receive a signal of the sixth contact C6 as an input In from the poly "POLY" at the fourteenth column. The inverter 125a may output an output signal through the eighth contact C8. Likewise, the polys POLY at the twelfth column, the thirteenth column, and the fourteenth column of the second region R2 may form the second latch 135 of the second bit flip-flop 130.

The structure of FIGS. 1, 2, and 3 may be implemented by the layout of FIG. 4. According to the layout of FIG. 4, the structure of FIGS. 1, 2, and 3 may be implemented with the polys POLY of the first to fourteenth columns, one diffusion brake DB2 between the polys POLY of the first to fourteenth columns, the first to fourth power contacts P1 to P4, and the first to fourth ground contacts G1 to G4. Accordingly, the multi-bit flip-flop circuit 100 may have decreased area.

In the described embodiment, the poly "POLY" at the first column of the first region R1 forms the first inverter 111 of the signal generation circuit 110 receiving the clock signal CK. However, in other embodiments the sixth-column poly "POLY" or the fourteenth-column poly "POLY" of the first region R1 or the second region R2, or the poly "POLY" at the first column of the second region R2 may form the first inverter 111 of the signal generation circuit 110 receiving the clock signal CK.

Likewise, in the described embodiment, the poly "POLY" at the first column of the second region R2 forms the second inverter 112 of the signal generation circuit 110 receiving the scan enable signal SE. However, in other embodiments the sixth-column poly "POLY" or the fourteenth-column poly "POLY" of the first region R1 or the second region R2, or the poly "POLY" at the first column of the first region R1 forms the second inverter 112 of the signal generation circuit 110 receiving the scan enable signal SE The multi-bit flip-flop circuit 100 including the first bit flip-flop 120 and the second bit flip-flop 130 is described with reference to FIGS. 1, 2, 3, and 4. However, a multi-bit flip-flop circuit according to an embodiment of the inventive concepts may include a first bit flip-flop to an m-th bit flip-flop (m being a positive integer greater than 1). A configuration and an operation of the first bit flip-flop may be identical to those of the first bit flip-flop of FIGS. 1, 2, 3, and 4. A configuration and an operation of a k-th bit flip-flop (k being a positive integer greater than 1, and m or less) may be identical to those of the first bit flip-flop except that an output data bit of a (k−1)-th bit flip-flop is received as a scan input.

Figure 5:
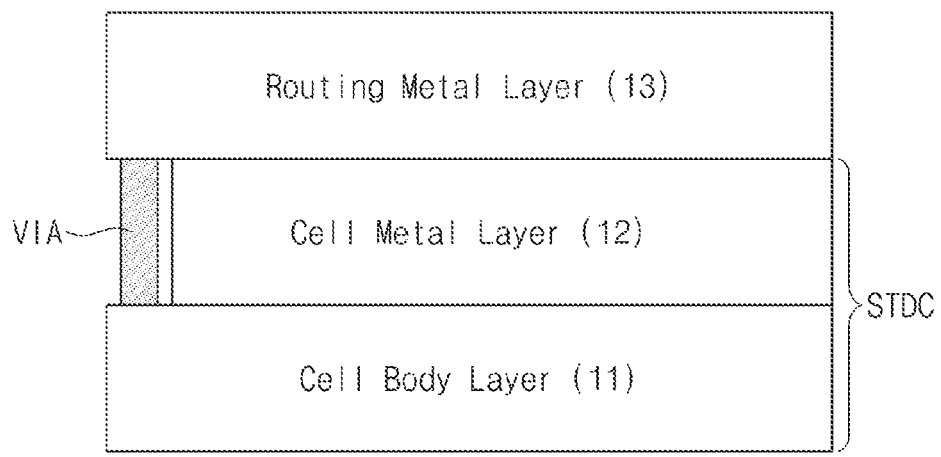
FIG. 5 illustrates an example of an electronic device including a standard cell of a multi-bit flip-flop circuit.

FIG. 5 illustrates an example of an electronic device including a standard cell STDC of the multi-bit flip-flop circuit 100. Referring to FIG. 5, the standard cell STDC of the multi-bit flip-flop circuit 100 may include a cell body layer 11 and a cell metal layer 12. The cell body layer 11 may include the active elements AE and the polys POLY described with reference to FIG. 4. The cell metal layer 12 may include internal wires that electrically connect components included in the cell body layer 11. The internal wires may include contacts and vias that are connected with a cell body in a direction perpendicular to the cell body (for example in a vertical direction with the cell metal layer 12 disposed on or over the cell body layer 11), and metals that extend in a direction parallel to the cell body to connect the vias.

A routing metal layer 13 may be provided on or over the cell metal layer 12. The routing metal layer 13 may include external wires that electrically connect the standard cell STDC of the multi-bit flip-flop circuit 100 with any other circuits of an electronic device or any other standard cells. The routing metal layer 13 may be connected with the cell body layer 11 through vias VIA. For example, the vias VIA may enable the communication of the following with the cell body layer 11: the clock signal CK, the scan enable signal SE, the first data bit D1, the second data bit D2, the scan input data bit SI, the first output data bit Q1, and the second output data bit Q2.

The vias VIA may include a first via that transfers the first output data bit Q1 from the first bit flip-flop 120 to the routing metal layer 13, and a second via that transfers the first output data bit Q1 from the routing metal layer 13 to the second bit flip-flop 130. Because the first output data bit Q1 is transferred as the scan input of the second bit flip-flop 130 through the second via among the vias VIA, the cell metal layer 12 does not require an internal wire for the scan input of the second bit flip-flop 130. Accordingly, the numbers of metals and/or metal layers used in the standard cell STDC of the multi-bit flip-flop circuit 100 may be decreased, and the design constraints associated with the standard cell STDC of the multi-bit flip-flop circuit 100 may become simpler.

Figure 6:
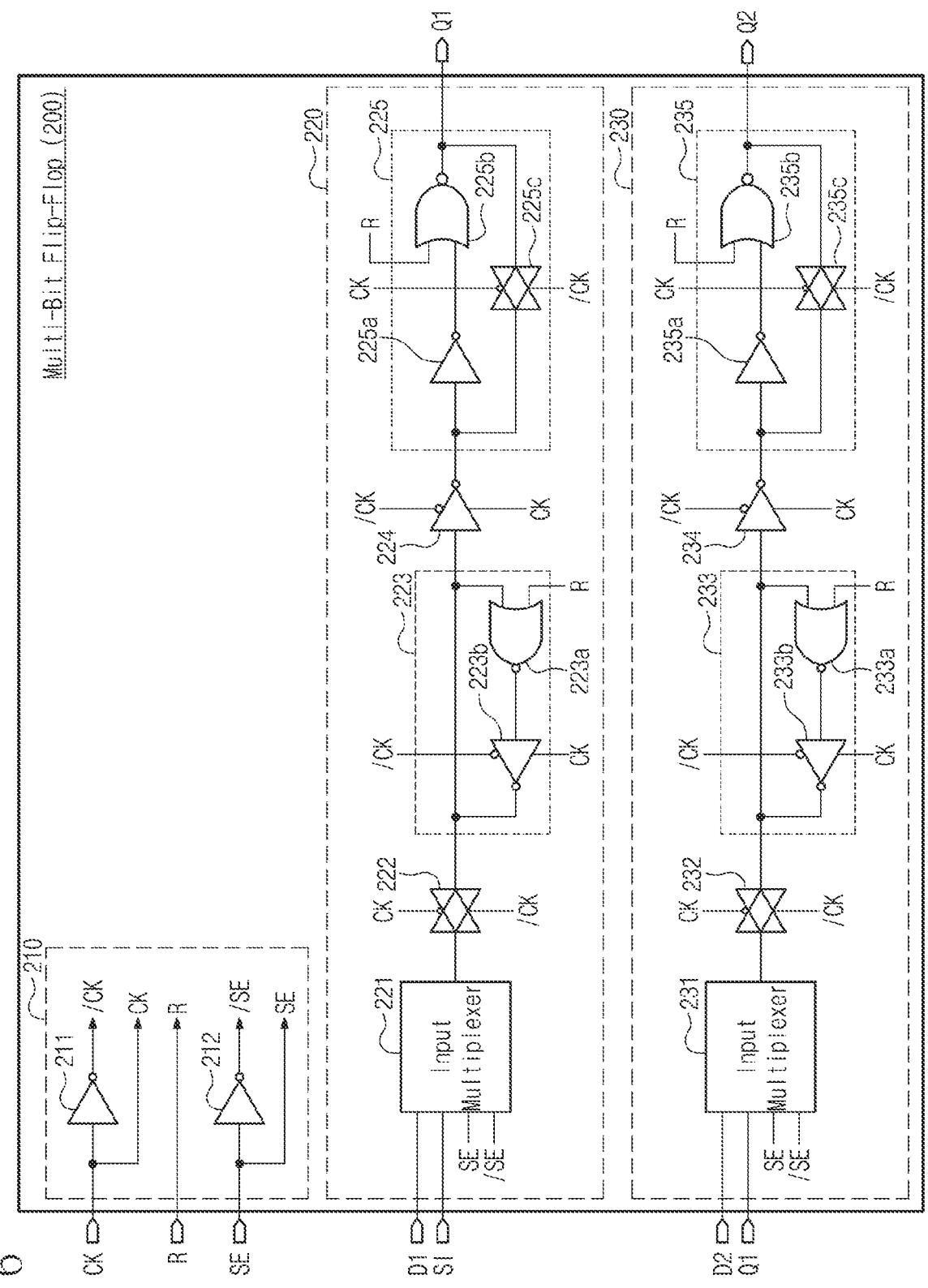
FIG. 6 illustrates a multi-bit flip-flop circuit according to an embodiment of the inventive concepts.

FIG. 6 illustrates a multi-bit flip-flop circuit 200 according to another embodiment of the inventive concepts. Referring to FIG. 6, the multi-bit flip-flop circuit 200 may include a signal generation circuit 210, a first bit flip-flop 220, and a second bit flip-flop 230.

The signal generation circuit 210 may include a first inverter 211 and a second inverter 212. A configuration and an operation of the signal generation circuit 210 may be identical to those of the signal generation circuit 110 described with reference to FIGS. 1, 2, 3, and 4. Thus, additional description will be omitted to avoid redundancy. Unless otherwise mentioned, the features described with reference to the signal generation circuit 110 of FIGS. 1, 2, 3, and 4 may be identically applied to the signal generation circuit 210 of FIG. 6.

The first bit flip-flop 220 may include an input multiplexer 221, a first transmission circuit 222, a first latch 223, a second transmission circuit 224, and a second latch 225. Configurations and operations of the input multiplexer 221, the first transmission circuit 222, and the second transmission circuit 224 may be respectively identical to those of the input multiplexer 121, the first transmission circuit 122, and the second transmission circuit 124 described with reference to FIGS. 1, 2, 3, and 4. Thus, additional description will be omitted to avoid redundancy. Unless otherwise mentioned, the features described with reference to the input multiplexer 121, the first transmission circuit 122, and the second transmission circuit 124 of FIGS. 1, 2, 3, and 4 may be identically applied to the input multiplexer 221, the first transmission circuit 222, and the second transmission circuit 224 of FIG. 6.

The first latch 223 may include a NOR gate 223*a* and a three-phase inverter 223*b*. Compared to the first latch 123 of FIGS. 1, 2, 3, and 4, the inverter 123*a* of the first latch 123 may be replaced with the NOR gate 223*a* in first latch 223 in FIG. 6. The NOR gate 223*a* may receive an output data bit of the first transmission circuit 222 and a reset signal "R"

When the reset signal "R" is at the low level, the NOR gate 223*a* may operate as an inverter. That is, the NOR gate 223*a* may perform an operation corresponding to the inverter 123*a* of the first latch 123 of FIG. 1. When the reset signal "R" is at the high level, the first latch 223 may be reset to store a value of "0" regardless of an output of the first transmission circuit 222. A configuration and an operation of the first latch 223 may be identical to those of the first latch 123 described with respect to FIGS. 1, 2, 3, and 4 except that the inverter 123*a* is replaced with the NOR gate 223*a* and the reset operation is performed depending on the reset signal "R". Thus, additional description will be omitted to avoid redundancy. Unless otherwise mentioned, the features described with reference to the first latch 123 of FIGS. 1, 2, 3, and 4 may be identically applied to the first latch 223 of FIG. 6.

The second latch 225 may include an inverter 225*a*, a NOR gate 225*b*, and a transmission circuit 225*c*. Compared to the second latch 125 of FIGS. 1, 2, 3, and 4, the second inverter 125*b* of the second latch 125 may be replaced with the NOR gate 225*b* in the second latch 225 in FIG. 6. The NOR gate 225*b* may receive an output data bit of the inverter 225*a* and the reset signal "R"

When the reset signal "R" is at the low level, the NOR gate 225*b* may operate as an inverter. That is, the NOR gate 225*b* may perform an operation corresponding to the second inverter 125*b* of the second latch 125 of FIG. 1. When the reset signal "R" is at the high level, the second latch 225 may be reset to store a value of "0" regardless of an output of the inverter 225*a*. A configuration and an operation of the second latch 225 may be identical to those of the second latch 125 described with respect to FIGS. 1, 2, 3, and 4 except that the inverter 125*b* is replaced with the NOR gate 225*b* and the reset operation is performed depending on the reset signal "R". Thus, additional description will be omitted to avoid redundancy. Unless otherwise mentioned, the features described with reference to the second latch 125 of FIGS. 1, 2, 3, and 4 may be identically applied to the second latch 225 of FIG. 6.

The second bit flip-flop 230 may include an input multiplexer 231, a first transmission circuit 232, a first latch 233, a second transmission circuit 234, and a second latch 235. The first latch 233 may include a NOR gate 233a and an inverter 233b. The second latch 235 may include an inverter 235a, a NOR gate 235b, and a transmission circuit 235c.

A configuration and an operation of the second bit flip-flop 230 may be identical to those of the first bit flip-flop 220 except that the first output data bit Q1 is transferred as the scan input of the second bit flip-flop 230. Thus, additional description will be omitted to avoid redundancy. Unless otherwise mentioned, features described with reference to the first bit flip-flop 220 may be identically applied to the second bit flip-flop 230.

In an embodiment, the multi-bit flip-flop circuit 200 may be modified to include a first bit flip-flop to an m-th bit flip-flop.

Figure 7:
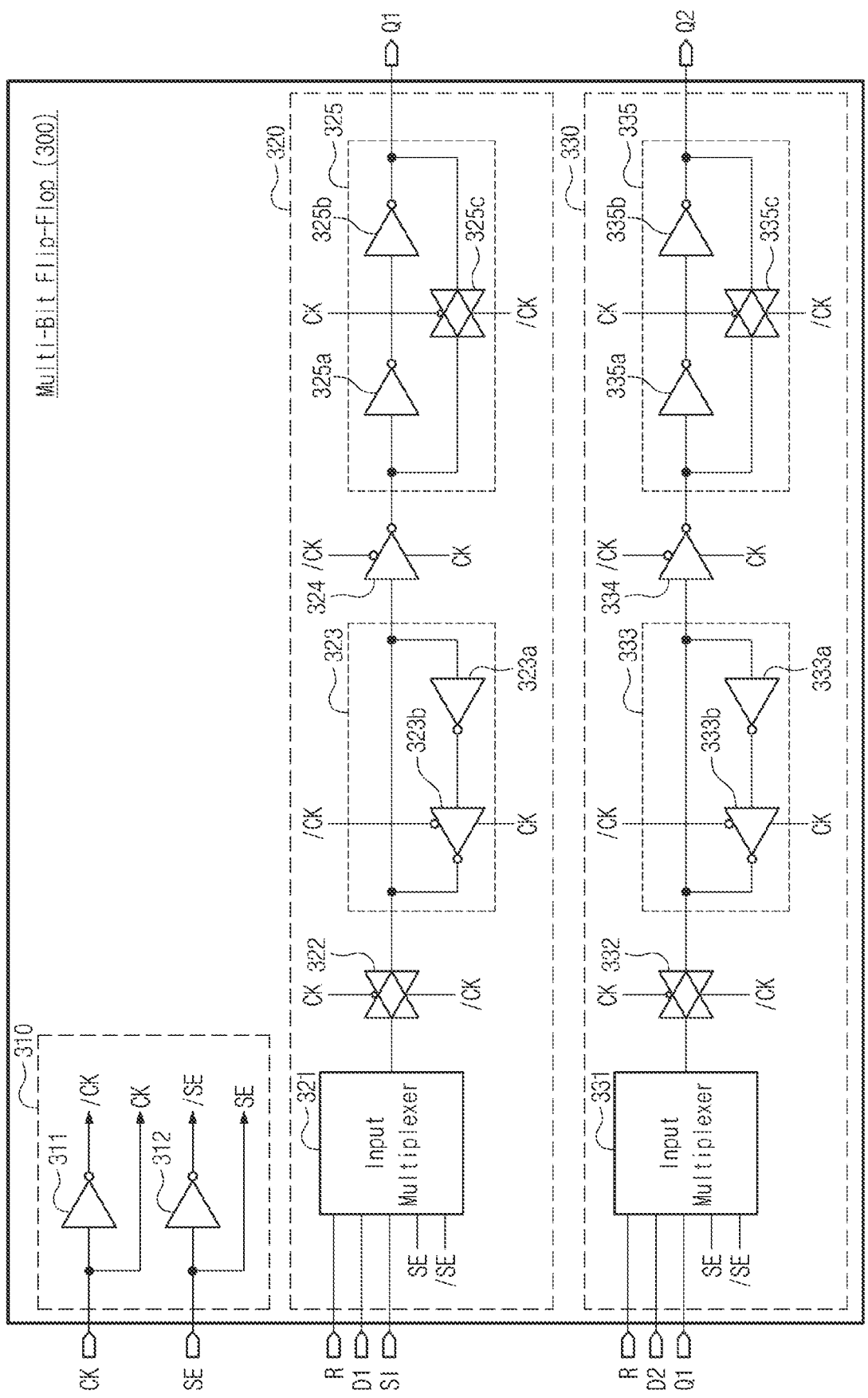
FIG. 7 illustrates a multi-bit flip-flop circuit according to an embodiment of the inventive concepts.

FIG. 7 illustrates a multi-bit flip-flop circuit 300 according to another embodiment of the inventive concepts. Referring to FIG. 7, the multi-bit flip-flop circuit 300 may include a signal generation circuit 310, a first bit flip-flop 320, and a second bit flip-flop 330.

The signal generation circuit 310 may include a first inverter 311 and a second inverter 312. A configuration and an operation of the signal generation circuit 310 may be identical to those of the signal generation circuit 110 described with reference to FIGS. 1, 2, 3, and 4. Thus, additional description will be omitted to avoid redundancy. Unless otherwise mentioned, the features described with reference to the signal generation circuit 110 of FIGS. 1, 2, 3, and 4 may be identically applied to the signal generation circuit 310 of FIG. 7.

The first bit flip-flop 320 may include an input multiplexer 321, a first transmission circuit 322, a first latch 323, a second transmission circuit 324, and a second latch 325. The first latch 323 may include an inverter 323a and a three-phase inverter 323b. The second latch 325 may include a first inverter 325a, a second inverter 325b, and a transmission circuit 325c.

Configurations and operations of the first transmission circuit 322, the first latch 323, the second transmission circuit 324, and the second latch 325 may be respectively identical to those of the first transmission circuit 122, the first latch 123, the second transmission circuit 124, and the second latch 125 described with reference to FIGS. 1, 2, 3, and 4. Thus, additional description will be omitted to avoid redundancy. Unless otherwise mentioned, the features described with reference to the first transmission circuit 122, the first latch 123, the second transmission circuit 124, and the second latch 125 of FIGS. 1, 2, 3, and 4 may be identically applied to the first transmission circuit 322, the first latch 323, the second transmission latch 324, and the second latch 325 of FIG. 7.

The input multiplexer 321 may further receive the reset signal "R". When the reset signal "R" is in the disable state (e.g., at the low level or the high level), an operation of the input multiplexer 321 may be identical to the operation of the input multiplexer 121 of FIGS. 1, 2, 3, and 4. When the reset signal "R" is in the enable state (e.g., at the high level or the low level), the input multiplexer 321 may output a reset value (e.g., "0" or "1") regardless of values of the first data bit D1 and the scan input data bit SI. A configuration and an operation of the input multiplexer 321 may be identical to those of the input multiplexer 121 described with reference to FIGS. 1, 2, 3, and 4 except that the reset operation is performed depending on the reset signal "R". Thus, additional description will be omitted to avoid redundancy. Unless otherwise mentioned, the features described with reference to the input multiplexer 121 of FIGS. 1, 2, 3, and 4 may be identically applied to the input multiplexer 321 of FIG. 7.

The second bit flip-flop 330 may include an input multiplexer 331, a first transmission circuit 332, a first latch 333, a second transmission circuit 334, and a second latch 335. The first latch 333 may include an inverter 333a and a three-phase inverter 333b. The second latch 335 may include a first inverter 335a, a second inverter 335b, and a transmission circuit 335c.

A configuration and an operation of the second bit flip-flop 330 may be identical to those of the first bit flip-flop 320 except that the first output data bit Q1 is transferred as the scan input of the second bit flip-flop 330. Thus, additional description will be omitted to avoid redundancy. Unless otherwise mentioned, the features described with reference to the first bit flip-flop 320 may be identically applied to the second bit flip-flop 330.

In an embodiment, the multi-bit flip-flop circuit 300 may be modified to include a first bit flip-flop to an m-th bit flip-flop.

Figure 8:
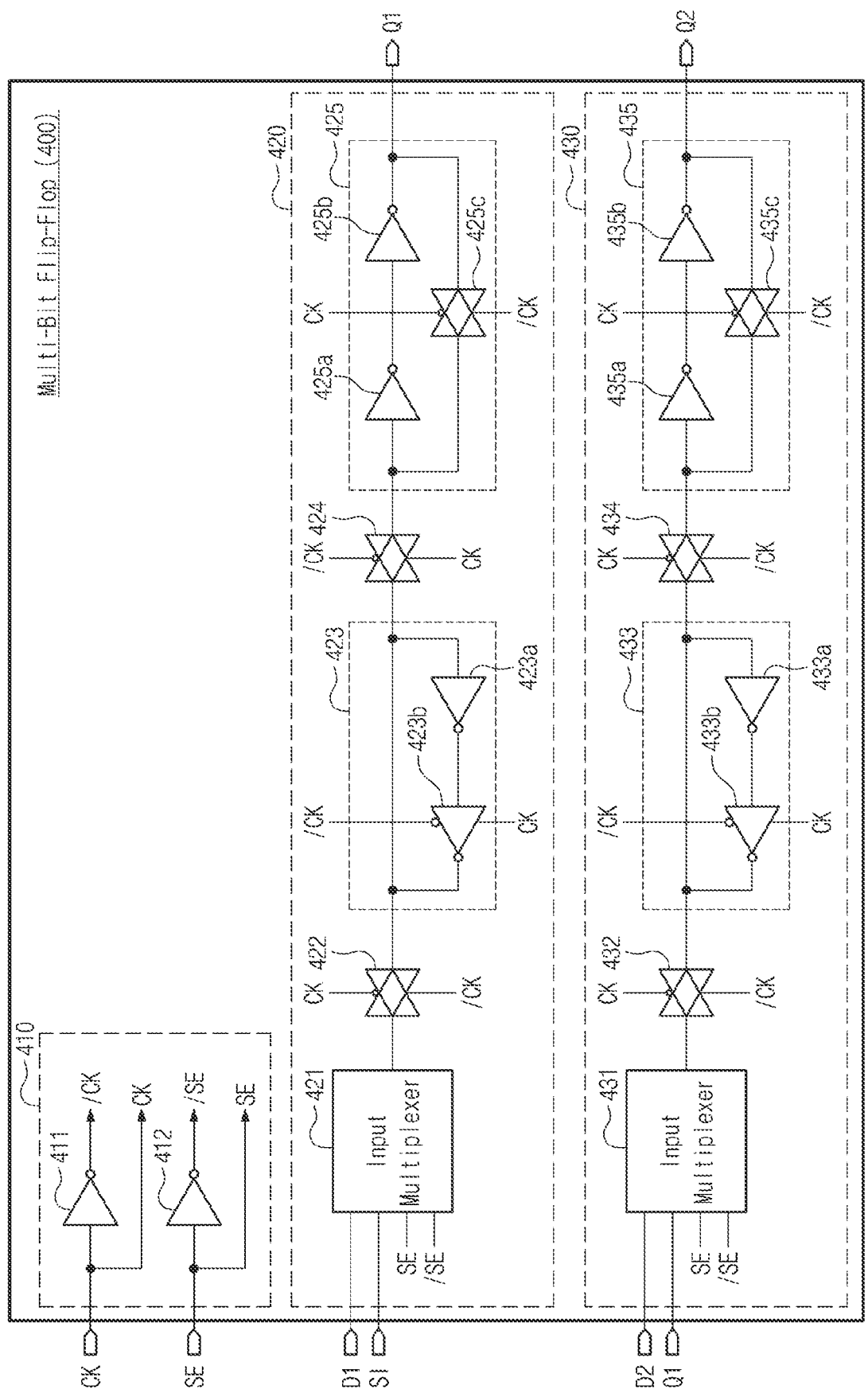
FIG. 8 illustrates a multi-bit flip-flop circuit according to an embodiment of the inventive concepts.

FIG. 8 illustrates a multi-bit flip-flop circuit 400 according to another embodiment of the inventive concepts. Referring to FIG. 8, the multi-bit flip-flop circuit 400 may include a signal generation circuit 410, a first bit flip-flop 420, and a second bit flip-flop 430.

The signal generation circuit 410 may include a first inverter 411 and a second inverter 412. A configuration and an operation of the signal generation circuit 410 may be identical to those of the signal generation circuit 110 described with reference to FIGS. 1, 2, 3, and 4. Thus, additional description will be omitted to avoid redundancy. Unless otherwise mentioned, the features described with reference to the signal generation circuit 110 of FIGS. 1, 2, 3, and 4 may be identically applied to the signal generation circuit 410 of FIG. 8.

The first bit flip-flop 420 may include an input multiplexer 421, a first transmission circuit 422, a first latch 423, a second transmission circuit 424, and a second latch 425. The first latch 423 may include an inverter 423a and a three-phase inverter 423b. The second latch 425 may include a first inverter 425a, a second inverter 425b, and a transmission circuit 425c.

Configurations and operations of the input multiplexer 421, the first transmission circuit 422, the first latch 423, and the second latch 425 may be respectively identical to those of the input multiplexer 121, the first transmission circuit 122, the first latch 123, and the second latch 125 of FIGS. 1, 2, 3, and 4. Thus, additional description will be omitted to avoid redundancy. Unless otherwise mentioned, the features described with reference to the input multiplexer 121, the first transmission circuit 122, the first latch 123, and the second latch 125 of FIGS. 1, 2, 3, and 4 may be identically applied to the input multiplexer 421, the first transmission circuit 422, the first latch 423, and the second latch 425 of FIG. 8.

The second transmission circuit 424 may include a transmission gate instead of the three-phase inverter described with reference to FIG. 1. The three-phase inverter may invert a data bit. In contrast, the transmission gate does not invert a data bit. Accordingly, to match a polarity of the first output data bit Q1 with a polarity of the first data bit D1, the second latch 425 may be changed to include an odd number of inverters (i.e., at least one inverter may be added to or removed from the second latch 425), and the transmission gate 425c may be replaced with the three-phase inverter.

The second bit flip-flop 430 may include an input multiplexer 431, a first transmission circuit 432, a first latch 433, a second transmission circuit 434, and a second latch 435. The first latch 433 may include an inverter 433a and a three-phase inverter 433b. The second latch 435 may include a first inverter 435a, a second inverter 435b, and a transmission circuit 435c.

A configuration and an operation of the second bit flip-flop 430 may be identical to those of the first bit flip-flop 420 except that the first output data bit Q1 is transferred as the scan input of the second bit flip-flop 430. Thus, additional description will be omitted to avoid redundancy. Unless otherwise mentioned, the features described with reference to the first bit flip-flop 420 may be identically applied to the second bit flip-flop 430.

In an embodiment, the multi-bit flip-flop circuit 400 may be modified to include a first bit flip-flop to an m-th bit flip-flop.

Figure 9:
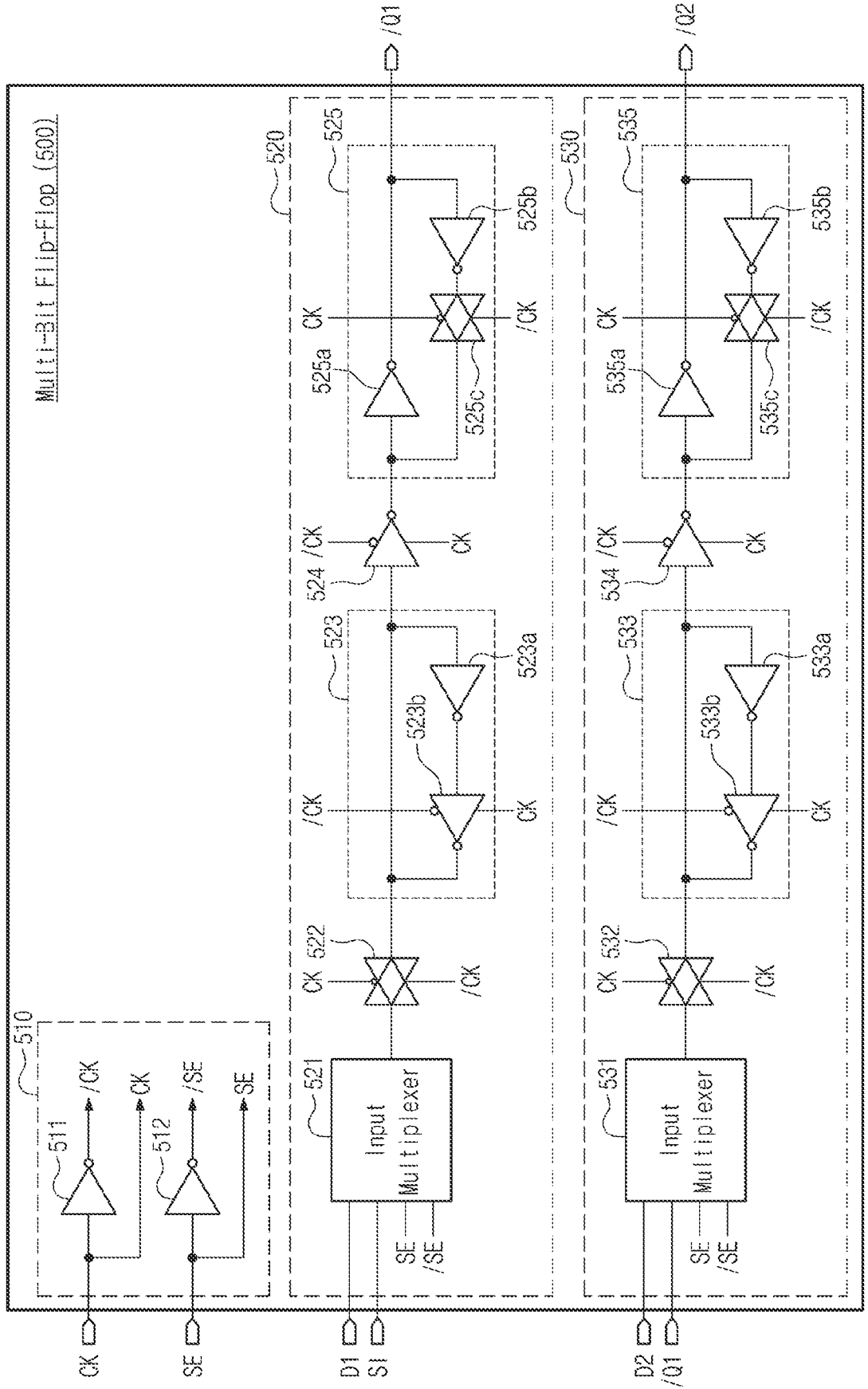
FIG. 9 illustrates a multi-bit flip-flop circuit according to an embodiment of the inventive concepts.

FIG. 9 illustrates a multi-bit flip-flop circuit 500 according to another embodiment of the inventive concepts. Referring to FIG. 9, the multi-bit flip-flop circuit 500 may include a signal generation circuit 510, a first bit flip-flop 520, and a second bit flip-flop 530.

The signal generation circuit 510 may include a first inverter 511 and a second inverter 512. A configuration and an operation of the signal generation circuit 510 may be identical to those of the signal generation circuit 110 described with reference to FIGS. 1, 2, 3, and 4. Thus, additional description will be omitted to avoid redundancy. Unless otherwise mentioned, the features described with reference to the signal generation circuit 110 of FIGS. 1, 2, 3, and 4 may be identically applied to the signal generation circuit 510 of FIG. 9.

The first bit flip-flop 520 may include an input multiplexer 521, a first transmission circuit 522, a first latch 523, a second transmission circuit 524, and a second latch 525. The first latch 523 may include an inverter 523a and a three-phase inverter 523b. The second latch 525 may include a first inverter 525a, a second inverter 525b, and a transmission circuit 525c.

Configurations and operations of the input multiplexer 521, the first transmission circuit 522, the first latch 523, and the second transmission circuit 524 may be respectively identical to those of the input multiplexer 121, the first transmission circuit 122, the first latch 123, and the second transmission circuit 124 of FIGS. 1, 2, 3, and 4. Thus, additional description will be omitted to avoid redundancy. Unless otherwise mentioned, the features described with reference to the input multiplexer 121, the first transmission circuit 122, the first latch 123, and the second transmission circuit 124 of FIGS. 1, 2, 3, and 4 may be identically applied to the input multiplexer 521, the first transmission circuit 522, the first latch 523, and the second transmission circuit 524 of FIG. 9.

The second latch 525 may include an inverter 525a, a second inverter 525b, and a transmission gate 525c. Compared to the second latch 125 of FIGS. 1, 2, 3, and 4, instead of the output of the second inverter 525b, an output of the first inverter 525a may be used as the first output data bit Q1 in the second latch 525 of FIG. 9. Accordingly, a polarity of the first output data bit Q1 may be opposite to a polarity of the first data bit D1. To match the polarity of the first output data bit Q1 with the polarity of the first data bit D1, as described with reference to FIG. 8, the second transmission circuit 524 may be replaced with a transmission circuit. A configuration and an operation of the second latch 525 may be identical to those of the second latch 125 described with reference to FIGS. 1, 2, 3, and 4 except that the output of the first inverter 525a is used as the first output data bit Q1. Thus, additional description will be omitted to avoid redundancy. Unless otherwise mentioned, the features described with reference to the second latch 125 of FIGS. 1, 2, 3, and 4 may be identically applied to the second latch 525 of FIG. 9.

The second bit flip-flop 530 may include an input multiplexer 531, a first transmission circuit 532, a first latch 533, a second transmission circuit 534, and a second latch 535. The first latch 533 may include an inverter 533a and a three-phase inverter 533b. The second latch 535 may include a first inverter 535a, a second inverter 535b, and a transmission circuit 535c.

A configuration and an operation of the second bit flip-flop 530 may be identical to those of the first bit flip-flop 520 except that the first output data bit Q1 is transferred as the scan input of the second bit flip-flop 530. Thus, additional description will be omitted to avoid redundancy. Unless otherwise mentioned, the features described with reference to the first bit flip-flop 520 may be identically applied to the second bit flip-flop 530.

In an embodiment, the multi-bit flip-flop circuit 500 may be modified to include a first bit flip-flop to an m-th bit flip-flop.

Figure 10:
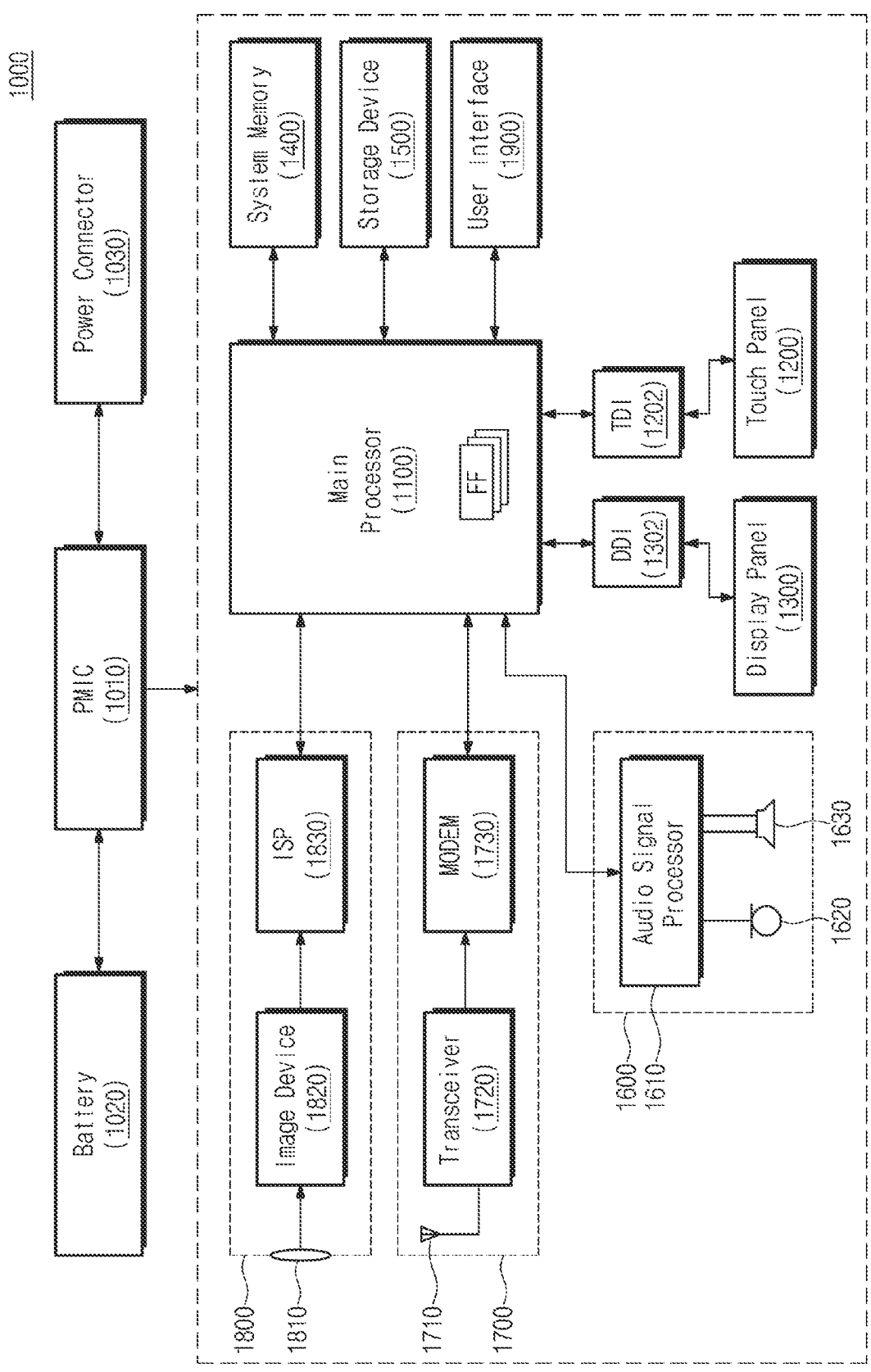
FIG. 10 illustrates an example of an electronic device according to an embodiment of the inventive concepts.

FIG. 10 illustrates an example of an electronic device 1000 according to an embodiment of the inventive concepts. Referring to FIG. 10, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an embodiment, the electronic device 1000 may be one of various electronic devices such as for example a personal computer, a laptop computer, a server, a workstation, a portable communication terminal, a personal digital assistant (PDA), a portable media player (PMP), a digital camera, a smartphone, a tablet computer, and a wearable device, or the like.

The main processor 1100 may control an overall operation of the electronic device 1000. The main processor 1100 may control/manage operations of the components of the electronic device 1000. The main processor 1100 may perform various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include volatile memory such as for example static random access memory (SRAM), dynamic RAM (DRAM), or synchronous DRAM (SDRAM), and/or nonvolatile memory such as for example phase change RAM (PRAM), magneto-resistive RAM (MRAM), resistive RAM (ReRAM), or ferroelectric RAM (FRAM).

The storage device 1500 may store data regardless of whether power is supplied. For example, the storage device 1500 may include at least one of various nonvolatile memories such as for example flash memory, PRAM, MRAM, ReRAM, and FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols such as for example long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive light through a lens 1810. An image device 1820 and an image signal processor (ISP) 1830 included in the image processor 1800 may generate image information about an external object, based on received light. The user interface 1900 may include an interface capable of exchanging information with a user, the exchanged information other than information provided via the touch panel 1200, the display panel 1300, the audio processor 1600, and the image processor 1800. The user interface 1900 may for example include a keyboard, a mouse, a printer, a projector, various sensors, a human body communication device, etc.

In some embodiments, the electronic device 1000 may further include a power management IC (PMIC) 1010, a battery 1020, and a power connector 1030 in addition to the aforementioned components. The power management IC 1010 may generate internal power from power supplied from the battery 1020 or power supplied from the power connector 1030, and may provide the internal power to the main processor 1100, the touch panel 1200, the touch driver integrated circuit (TDI) 1202, the display panel 1300, the display driver integrated circuit (DDI) 1302, the system memory 1400, the storage device 1500, the audio processor 1600, the communication block 1700, the image processor 1800, and the user interface 1900.

The main processor 1100 may include flip-flops FF. At least one of the flip-flops FF may include the multi-bit flip-flop circuit 100, 200, 300, 400, or 500 described with reference to FIGS. 1 to 9. In an embodiment, the remaining components of the electronic device 1000 other than the main processor 1100 may also include flip-flops, and at least one of the flip-flops may include the multi-bit flip-flop circuit 100, 200, 300, 400, or 500 described with reference to FIGS. 1 to 9.

Each of the components of the electronic device 1000 may include a safety monitor device. Also, the safety monitor device may be connected with each of channels between the components of the electronic device 1000. The safety monitor device may check the integrity of each component or the integrity of a signal, a voltage, or a current between components. The electronic device 1000 may be implemented in an in-vehicle infotainment system. A safety monitor device SM may be implemented based on the ISO26262 or automotive safety integrity level (ASIL).

Alternatively, the electronic device 1000 may be implemented with various mobile devices such as a smartphone and a smart pad. Alternatively, the electronic device 1000 may be implemented with various wearable devices such as a smart watch, smart glasses, and a virtual reality goggle.

In the above embodiments, components according to inventive concepts are described by using the terms "first", "second", "third", etc. However, the terms "first", "second", "third", etc. may be used to distinguish components from each other and do not limit the inventive concepts. For example, the terms "first", "second", "third", etc. do not involve an order or a numerical meaning of any form.

In the above embodiments, components according to embodiments of the inventive concepts are referenced by using blocks. The blocks may be implemented with various hardware devices, such as integrated circuits, application specific ICs (ASICs), field programmable gate arrays (FPGAs), and complex programmable logic devices (CPLDs), firmware driven in hardware devices, software such as applications, or a combination of hardware devices and software. Also, the blocks may include circuits implemented with semiconductor elements in integrated circuits, or circuits enrolled as an intellectual property (IP).

According to the inventive concepts, a multi-bit flip-flop circuit may be implemented by using one diffusion brake. Accordingly, the multi-bit flip-flop circuit may have decreased area. Also, according to the inventive concepts, the multi-bit flip-flop circuit does not require a separate wire for a scan input. Accordingly, wiring complexity of the multi-bit flip-flop circuit may be decreased.

While the inventive concepts have been described with reference to embodiments thereof, it will be apparent to those of ordinary skill in the art that various changes and modifications may be made thereto without departing from the spirit and scope of the inventive concepts as set forth in the following claims.

What is claimed is:
1. A multi-bit flip-flop comprising:
a first bit flip-flop; and
a second bit flip-flop,
wherein the first bit flip-flop comprises
a first input multiplexer configured to receive a first data bit as a data input, receive a second data bit as a scan input, and output one of the first data bit and the second data bit as a third data bit,
a first transmission circuit configured to output a fourth data bit in response to the third data bit in synchronization with a clock signal and an inverse clock signal,
a first latch configured to store the fourth data bit in synchronization with the clock signal and the inverse clock signal,
a second transmission circuit configured to output a fifth data bit in response to the fourth data bit in synchronization with the clock signal and the inverse clock signal, and
a second latch configured to store the fifth data bit and output a sixth data bit as a first output data bit in response to the fifth data bit, and
wherein the second bit flip-flop comprises
a second input multiplexer configured to receive a seventh data bit as a data input, receive the sixth data bit as a scan input, and output one of the seventh data bit and the sixth data bit as an eighth data bit,
a third transmission circuit configured to output a ninth data bit in response to the eighth data bit in synchronization with the clock signal and the inverse clock signal,
a third latch configured to store the ninth data bit in synchronization with the clock signal and the inverse clock signal,
a fourth transmission circuit configured to output a tenth data bit in response to the ninth data bit in synchronization with the clock signal and the inverse clock signal, and a fourth latch configured to store the tenth data bit and output an eleventh data bit as a second output data bit in response to the tenth data bit.

2. The multi-bit flip-flop of claim 1, wherein each of the first and third transmission circuits comprise a transmission gate,
the transmission gate of the first transmission circuit configured to transfer the third data bit to be provided as the fourth data bit, and the transmission gate of the third transmission circuit configured to transfer the eighth data bit to be provided as the ninth data bit.

3. The multi-bit flip-flop of claim 1, wherein the first latch comprises a first inverter configured to receive the fourth data bit, and a first three-phase inverter configured to transfer an output of the first inverter to an input of the first inverter in synchronization with the clock signal and the inverse clock signal, and
wherein the third latch comprises a second inverter configured to receive the ninth data bit, and a second three-phase inverter configured to transfer an output of the second inverter to an input of the second inverter in synchronization with the clock signal and the inverse clock signal.

4. The multi-bit flip-flop of claim 1, wherein each of the second and fourth transmission circuits comprise a three-phase inverter,
the three-phase inverter of the second transmission circuit configured to invert the fourth data bit to provide the fifth data bit in synchronization with the clock signal and the inverse clock signal, and the three-phase inverter of the fourth transmission circuit configured to invert the ninth data bit to provide the tenth data bit in synchronization with the clock signal and the inverse clock signal.

5. The multi-bit flip-flop of claim 1, wherein the second latch comprises:
a first inverter configured to receive the fifth data bit;
a second inverter configured to receive an output of the first inverter and output the sixth data bit; and
a first transmission gate configured to transfer the sixth data bit to an input of the first inverter in synchronization with the clock signal and the inverse clock signal, and
wherein the fourth latch comprises
a third inverter configured to receive the tenth data bit;
a fourth inverter configured to receive an output of the third inverter and output the eleventh data bit; and
a second transmission gate configured to transfer the eleventh data bit to an input of the third inverter in synchronization with the clock signal and the inverse clock signal.

6. The multi-bit flip-flop of claim 1, wherein the multi-bit flip-flop is implemented as a standard cell,
wherein the second latch of the first bit flip-flop outputs the sixth data bit to an outside of the standard cell, and
wherein the second input multiplexer of the second bit flip-flop receives the sixth data bit from the outside of the standard cell.

7. The multi-bit flip-flop of claim 1, further comprising a signal generation circuit configured to receive the clock signal, output the clock signal and the inverse clock signal, receive a scan enable signal, and output the scan enable signal and an inverse scan enable signal,
wherein the first input multiplexer outputs the third data bit in response to the scan enable signal and the inverse scan enable signal, and the second input multiplexer outputs the eighth data bit in response to the scan enable signal and the inverse scan enable signal.

8. The multi-bit flip-flop of claim 1, wherein the first latch comprises a first NOR gate configured to receive the fourth data bit as a first input and a reset signal as a second input, and a first three-phase inverter configured to transfer an output of the first NOR gate to the first input of the first NOR gate in synchronization with the clock signal and the inverse clock signal, and
the third latch comprises a second NOR gate configured to receive the ninth data bit as a first input and the reset signal as a second input, and a second three-phase inverter configured to transfer an output of the second NOR gate to the first input of the second NOR gate in synchronization with the clock signal and the inverse clock signal.

9. The multi-bit flip-flop of claim 1, wherein the second latch comprises:
a first inverter configured to receive the fifth data bit;
a first NOR gate configured to receive an output of the first inverter as a first input and a reset signal as a second input, and output the sixth data bit; and
a first transmission gate configured to transfer the sixth data bit to an input of the first inverter in synchronization with the clock signal and the inverse clock signal, and
the fourth latch comprises
a second inverter configured to receive the tenth data bit;
a second NOR gate configured to receive an output of the second inverter as a first input and the reset signal as a second input, and output the eleventh data bit; and
a second transmission gate configured to transfer the eleventh data bit to an input of the second inverter in synchronization with the clock signal and the inverse clock signal.

10. The multi-bit flip-flop of claim 1, wherein the first input multiplexer and the second input multiplexer respectively set the third data bit and the eighth data bit to a reset value in response to a reset signal.

11. The multi-bit flip-flop of claim 1, wherein each of the second and fourth transmission circuits comprise a transmission gate,
wherein the transmission gate of the second transmission circuit is configured to transfer the fourth data bit to be provided as the fifth data bit, and the transmission gate of the fourth transmission circuit is configured to transfer the ninth data bit to be provided as the tenth data bit.

12. The multi-bit flip-flop of claim 1, wherein the second latch comprises:
a first inverter configured to receive the fifth data bit and output the sixth data bit;
a second inverter configured to receive the sixth data bit; and
a first transmission gate configured to transfer an output of the second inverter to an input of the first inverter in synchronization with the clock signal and the inverse clock signal, and
the fourth latch comprises
a third inverter configured to receive the tenth data bit and output the eleventh data bit;
a fourth inverter configured to receive the eleventh data bit; and
a second transmission gate configured to transfer an output of the fourth inverter to an input of the third inverter in synchronization with the clock signal and the inverse clock signal.

13. The multi-bit flip-flop of claim 1, further comprising a third bit flip-flop,
the third bit flip-flop comprising:
a third input multiplexer configured to receive a twelfth data bit as a data input, receive the eleventh data bit as a scan input, and output one of the twelfth data bit and the eleventh data bit as a thirteenth data bit;
a fifth transmission circuit configured to output a fourteenth data bit in response to the thirteenth data bit in synchronization with the clock signal and the inverse clock signal;
a fifth latch configured to store the fourteenth data bit in synchronization with the clock signal and the inverse clock signal;
a sixth transmission circuit configured to output a fifteenth data bit in response to the fourteenth data bit in synchronization with the clock signal and the inverse clock signal; and
a sixth latch configured to store the fifteenth data bit and output a sixteenth data bit as a third output data bit in response to the fifteenth data bit.

14. A multi-bit flip-flop comprising:
a signal generation circuit configured to receive a clock signal, output the clock signal and an inverse clock signal, receive a scan enable signal, and output the scan enable signal and an inverse scan enable signal;
a first bit flip-flop; and
a second bit flip-flop,
wherein the first bit flip-flop comprises
a first input multiplexer configured to receive a first data bit as a data input, receive a second data bit as a scan input, and output one of the first data bit and the second data bit as a third data bit in response to the scan enable signal and the inverse scan enable signal,
a first transmission circuit configured to output a fourth data bit in response to the third data bit in synchronization with the clock signal and the inverse clock signal,
a first latch configured to store the fourth data bit in synchronization with the clock signal and the inverse clock signal,
a second transmission circuit configured to output a fifth data bit in response to the fourth data bit in synchronization with the clock signal and the inverse clock signal, and
a second latch configured to store the fifth data bit and output a sixth data bit as a first output data bit in response to the fifth data bit, and
wherein the second bit flip-flop comprises
a second input multiplexer configured to receive a seventh data bit as a data input, receive the sixth data bit as a scan input, and output one of the seventh data bit and the sixth data bit as an eighth data bit,
a third transmission circuit configured to output a ninth data bit in response to the eighth data bit in synchronization with the clock signal and the inverse clock signal,
a third latch configured to store the ninth data bit in synchronization with the clock signal and the inverse clock signal,
a fourth transmission circuit configured to output a tenth data bit in response to the ninth data bit in synchronization with the clock signal and the inverse clock signal, and
a fourth latch configured to store the tenth data bit and output an eleventh data bit as a second output data bit in response to the tenth data bit, and
wherein the first input multiplexer and the second input multiplexer respectively set the third data bit and the eighth data bit to a reset value in response to a reset signal.

15. The multi-bit flip-flop of claim 14, wherein each of the first and third transmission circuits comprise a transmission gate,
the transmission gate of the first transmission circuit configured to transfer the third data bit to be provided as the fourth data bit, and the transmission gate of the third transmission circuit configured to transfer the eighth data bit to be provided as the ninth data bit.

16. The multi-bit flip-flop of claim 14, wherein the first latch comprises a first inverter configured to receive the fourth data bit, and a first three-phase inverter configured to transfer an output of the first inverter to an input of the first inverter in synchronization with the clock signal and the inverse clock signal, and
wherein the third latch comprises a second inverter configured to receive the ninth data bit, and a second three-phase inverter configured to transfer an output of the second inverter to an input of the second inverter in synchronization with the clock signal and the inverse clock signal.

17. The multi-bit flip-flop of claim 14, wherein each of the second and fourth transmission circuits comprise a three-phase inverter,
the three-phase inverter of the second transmission circuit configured to invert the fourth data bit to provide the fifth data bit in synchronization with the clock signal and the inverse clock signal, and the three-phase inverter of the fourth transmission circuit configured to invert the ninth data bit to provide the tenth data bit in synchronization with the clock signal and the inverse clock signal.

18. The multi-bit flip-flop of claim 14, wherein the second latch comprises:
a first inverter configured to receive the fifth data bit;
a second inverter configured to receive an output of the first inverter and output the sixth data bit; and
a first transmission gate configured to transfer the sixth data bit to an input of the first inverter in synchronization with the clock signal and the inverse clock signal, and
wherein the fourth latch comprises
a third inverter configured to receive the tenth data bit;
a fourth inverter configured to receive an output of the third inverter and output the eleventh data bit; and
a second transmission gate configured to transfer the eleventh data bit to an input of the third inverter in synchronization with the clock signal and the inverse clock signal.

19. The multi-bit flip-flop of claim 14, wherein the multi-bit flip-flop is implemented as a standard cell,
wherein the second latch of the first bit flip-flop outputs the sixth data bit to an outside of the standard cell, and
wherein the second input multiplexer of the second bit flip-flop receives the sixth data bit from the outside of the standard cell.

20. A multi-bit flip-flop comprising:
a signal generation circuit configured to receive a clock signal, output the clock signal and an inverse clock signal, receive a scan enable signal, and output the scan enable signal and an inverse scan enable signal;
a first bit flip-flop; and
a second bit flip-flop,
wherein the first bit flip-flop comprises a first input multiplexer configured to receive a first data bit as a data input, receive a second data bit as a scan input, and output one of the first data bit and the second data bit as a third data bit in response to the scan enable signal and the inverse scan enable signal, a first transmission circuit configured to output a fourth data bit in response to the third data bit in synchronization with the clock signal and the inverse clock signal, a first latch configured to store the fourth data bit in synchronization with the clock signal and the inverse clock signal, a second transmission circuit configured to output a fifth data bit in response to the fourth data bit in synchronization with the clock signal and the inverse clock signal, and a second latch configured to store the fifth data bit and output a sixth data bit as a first output data bit in response to the fifth data bit, and wherein the second bit flip-flop comprises a second input multiplexer configured to receive a seventh data bit as a data input, receive the sixth data bit as a scan input, and output one of the seventh data bit and the sixth data bit as an eighth data bit, a third transmission circuit configured to output a ninth data bit in response to the eighth data bit in synchronization with the clock signal and the inverse clock signal, a third latch configured to store the ninth data bit in synchronization with the clock signal and the inverse clock signal, a fourth transmission circuit configured to output a tenth data bit in response to the ninth data bit in synchronization with the clock signal and the inverse clock signal, and a fourth latch configured to store the tenth data bit and to output an eleventh data bit as a second output data bit in response to the tenth data bit, wherein each of the first and third transmission circuits comprise a first transmission gate, the first transmission gate of the first transmission circuit configured to transfer the third data bit to be provided as the fourth data bit, and the first transmission gate of the third transmission circuit configured to transfer the eighth data bit to be provided as the ninth data bit, wherein the first latch comprises a first inverter configured to receive the fourth data bit, and a first three-phase inverter configured to transfer an output of the first inverter to an input of the first inverter in synchronization with the clock signal and the inverse clock signal, and wherein the third latch comprises a second inverter configured to receive the ninth data bit, and a second three-phase inverter configured to transfer an output of the second inverter to an input of the second inverter in synchronization with the clock signal and the inverse clock signal, wherein each of the second and fourth transmission circuits comprise a third three-phase inverter, the third three-phase inverter of the second transmission circuit configured to invert the fourth data bit to provide the fifth data bit in synchronization with the clock signal and the inverse clock signal, and the third three-phase inverter of the fourth transmission circuit configured to invert the ninth data bit to provide the tenth data bit in synchronization with the clock signal and the inverse clock signal, and wherein the second latch comprises a third inverter configured to receive the fifth data bit, a fourth inverter configured to receive an output of the third inverter and output the sixth data bit, and a second transmission gate configured to transfer the sixth data bit to an input of the third inverter in synchronization with the clock signal and the inverse clock signal, and wherein the fourth latch comprises a fifth inverter configured to receive the tenth data bit, a sixth inverter configured to receive an output of the fifth inverter and output the eleventh data bit, and a third transmission gate configured to transfer the eleventh data bit to an input of the fifth inverter in synchronization with the clock signal and the inverse clock signal.

* * * * *